United States Patent
Tamura et al.

(10) Patent No.: US 7,424,695 B2
(45) Date of Patent: Sep. 9, 2008

(54) METHOD OF MANUFACTURING A SEMICONDUCTOR INTEGRATED CIRCUIT, A PROGRAM FOR A COMPUTER AUTOMATED DESIGN SYSTEM, AND A SEMICONDUCTOR INTEGRATED CIRCUIT

(75) Inventors: Naoyuki Tamura, Kanagawa-ken (JP); Yukihiro Urakawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 305 days.

(21) Appl. No.: 11/354,958

(22) Filed: Feb. 16, 2006

(65) Prior Publication Data
US 2006/0203531 A1    Sep. 14, 2006

(30) Foreign Application Priority Data
Feb. 17, 2005    (JP)    ............................. 2005-041158

(51) Int. Cl.
*G06F 17/50*    (2006.01)
(52) U.S. Cl. ............................. 716/14; 716/12; 716/13
(58) Field of Classification Search ............. 716/12–14; 365/63
See application file for complete search history.

(56) References Cited

U.S. PATENT DOCUMENTS 6,496,968 B1 * 12/2002 Yamada et al. ................. 716/12
6,858,928 B1 *  2/2005 Teig et al. ..................... 257/700

OTHER PUBLICATIONS

Gang Xu, et al., "Redundant-Via Enhanced Maze Routing for Yield Improvement", Proc of ASPDAC, 2005, 4 Pages.

* cited by examiner

*Primary Examiner*—Stacy A Whitmore
*Assistant Examiner*—Magid Y Dimyan
(74) *Attorney, Agent, or Firm*—Oblon, Spivak, McClelland, Maier & Neustadt, P.C.

(57) ABSTRACT

A method for manufacturing a semiconductor integrated circuit uses layout data designed by a sequence of processes. The sequence of processes includes disposing a lower-layer wiring pattern on an imaginary lower-layer wiring layer and an upper-layer wiring pattern perpendicular to the lower-layer wiring pattern on an imaginary upper-layer wiring layer implemented in the graphics image space, providing a detour pattern including a first detour pattern connected to the upper-layer wiring pattern, providing a plurality of via patterns connecting the lower-layer and upper-layer wiring patterns, and forming a via cell pattern.

7 Claims, 24 Drawing Sheets

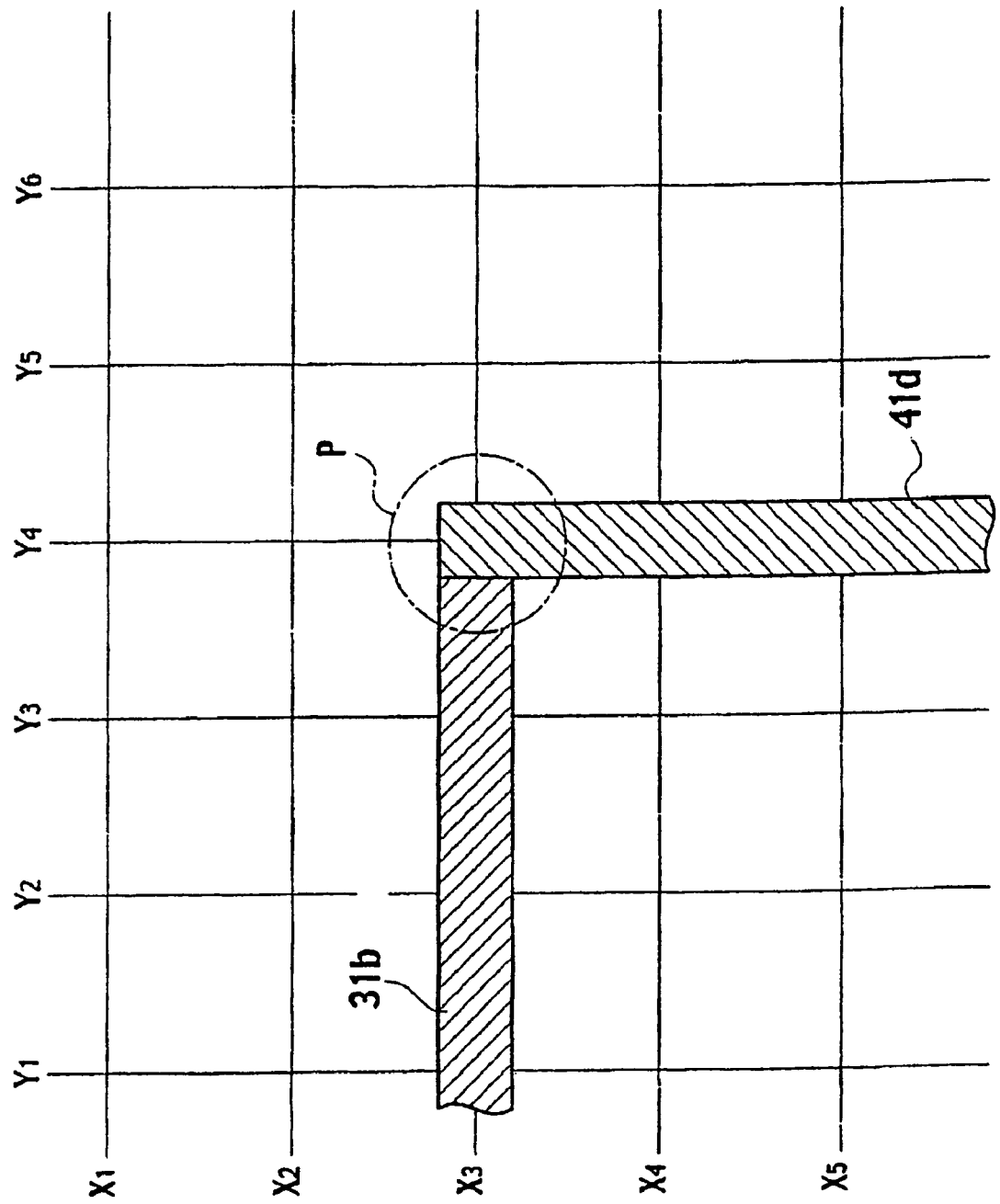

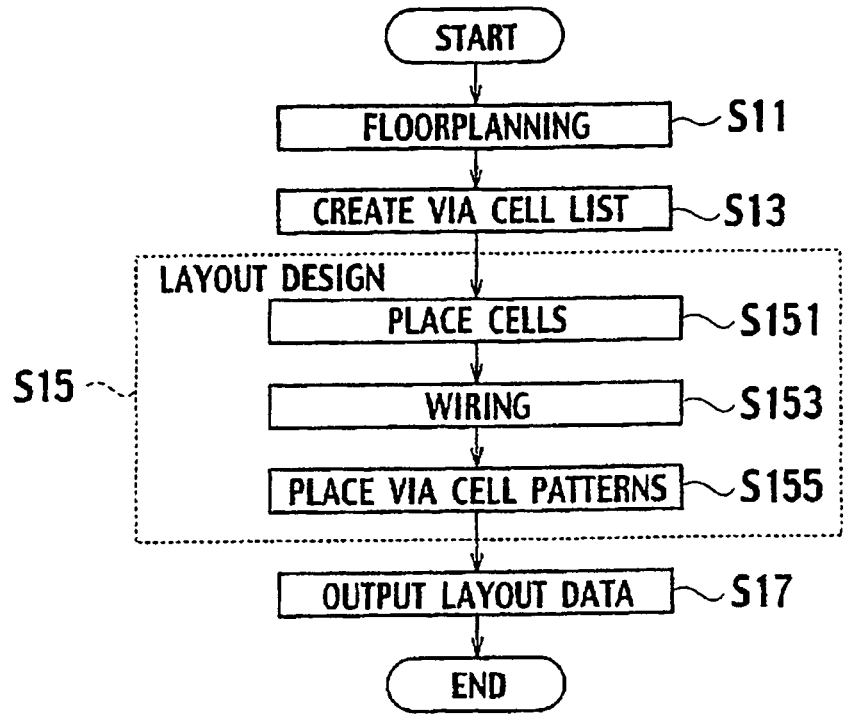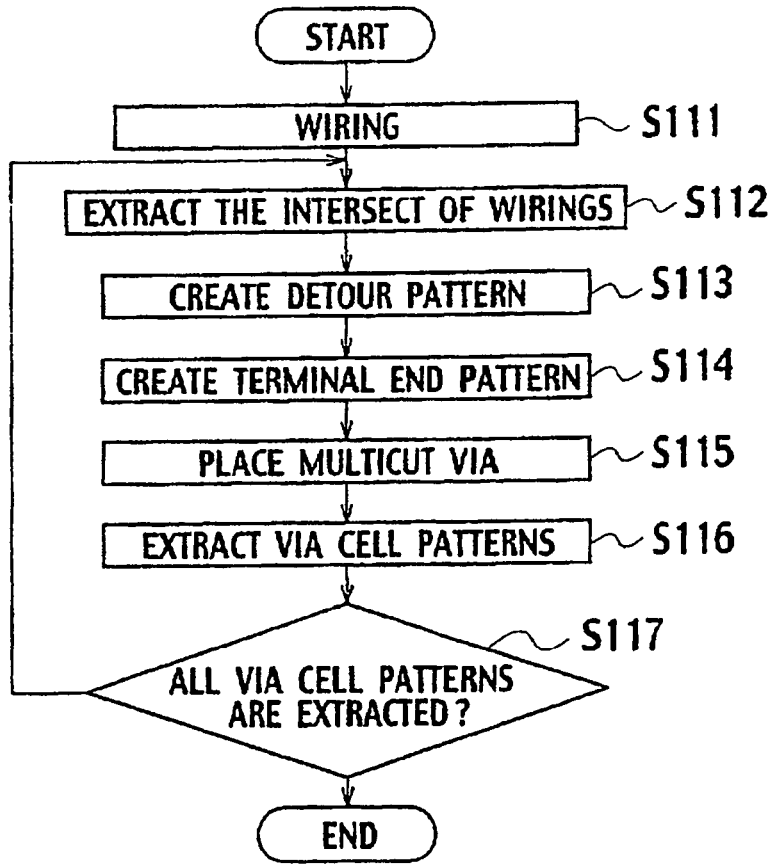

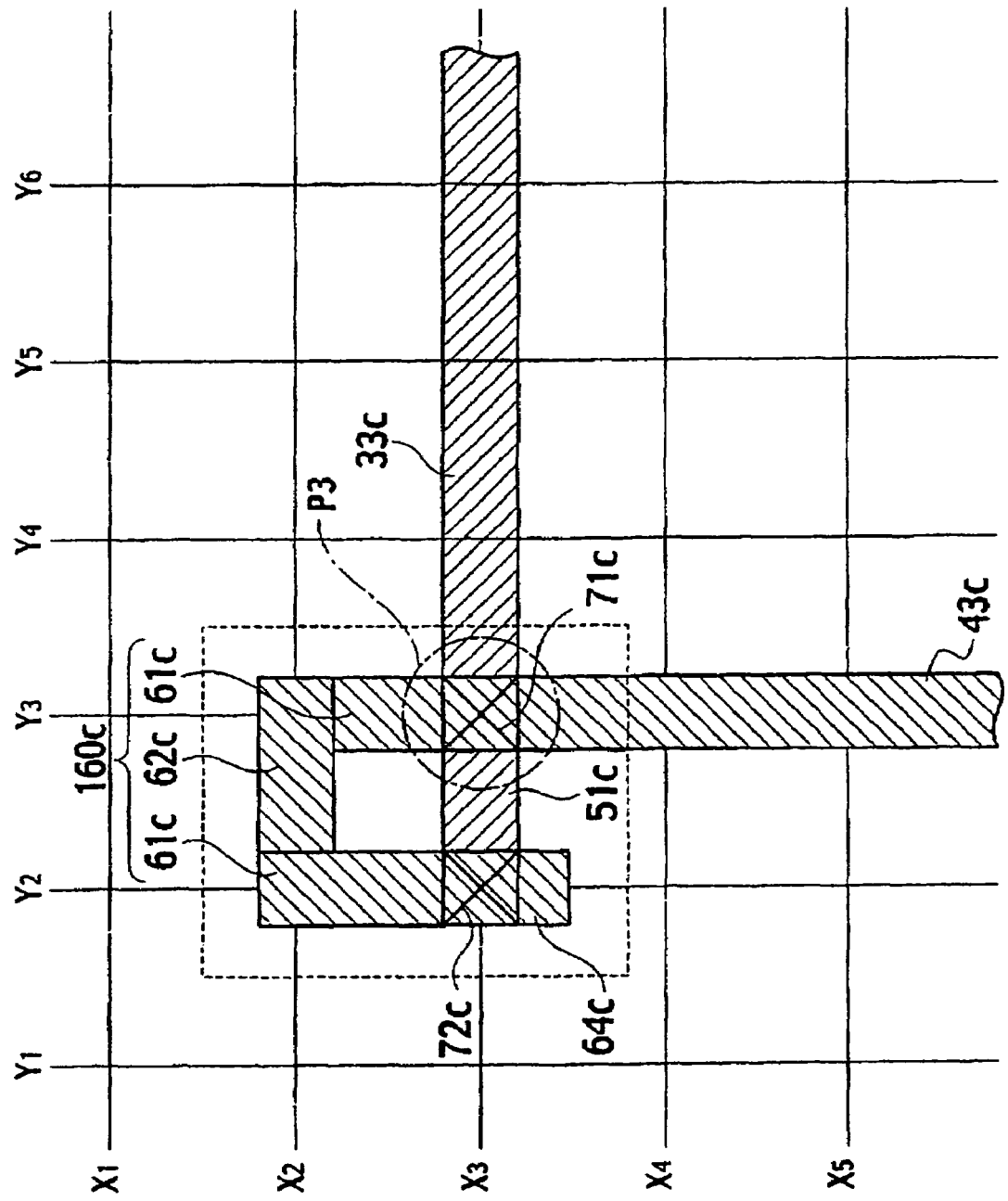

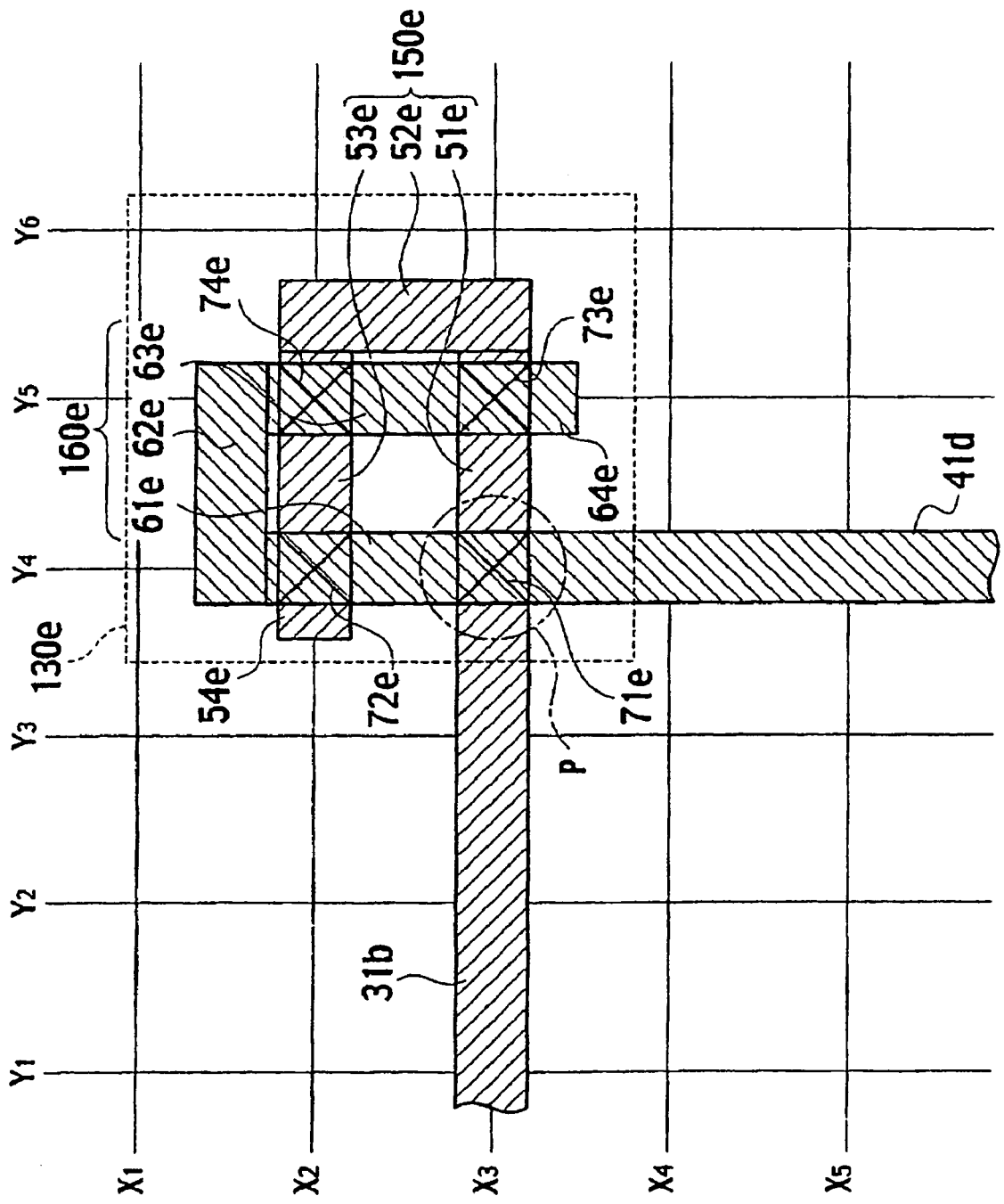

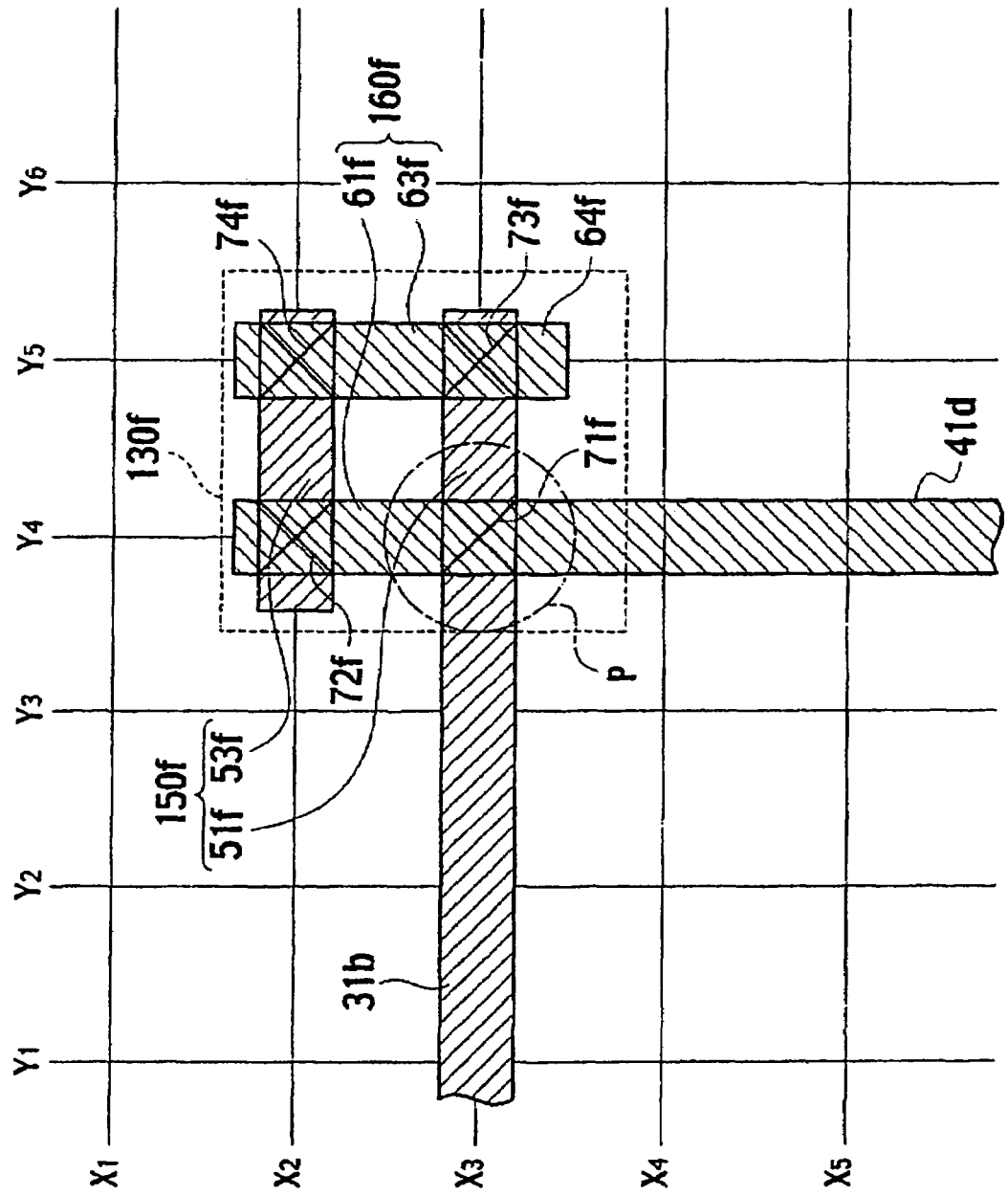

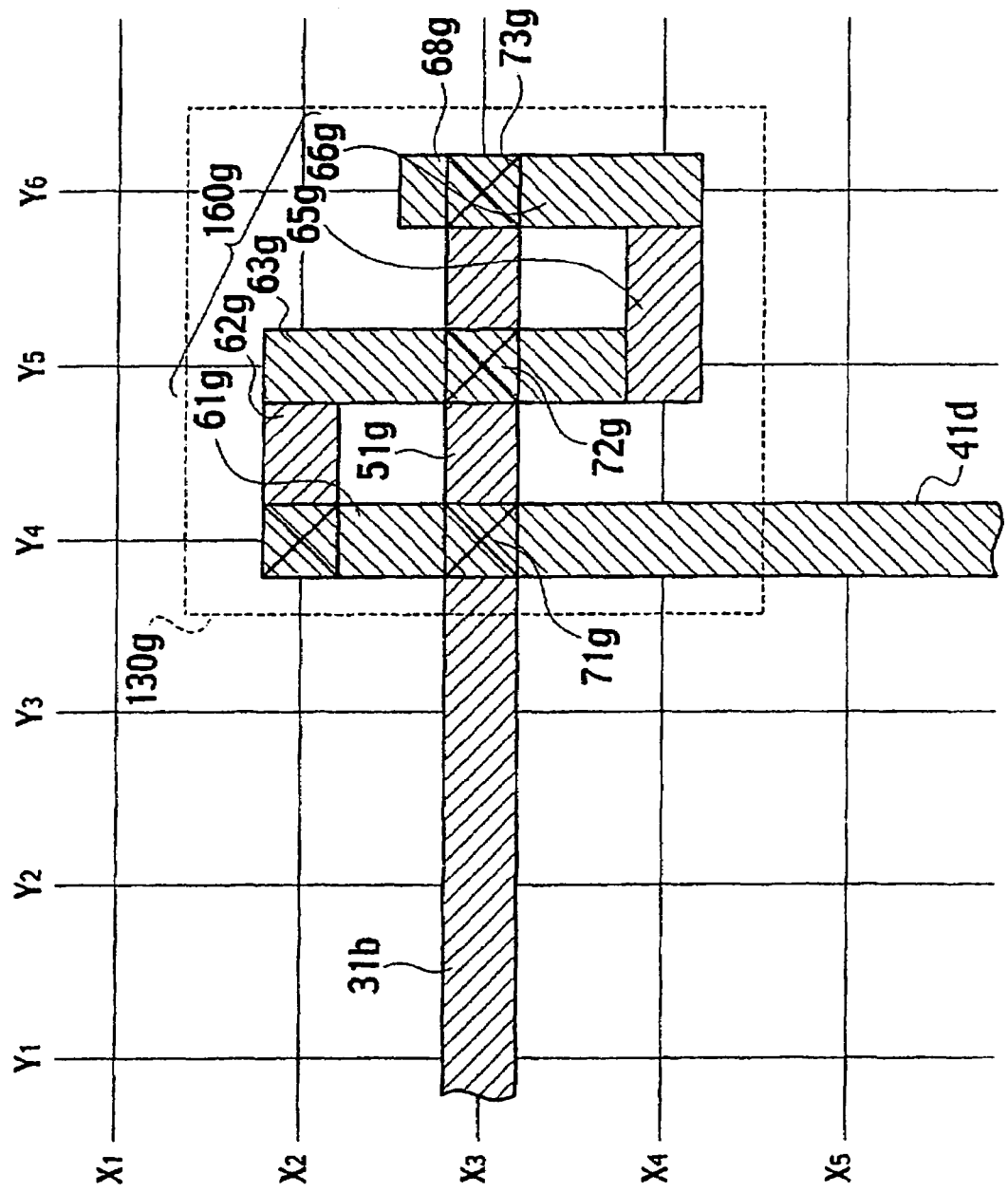

METHOD OF MANUFACTURING A SEMICONDUCTOR INTEGRATED CIRCUIT, A PROGRAM FOR A COMPUTER AUTOMATED DESIGN SYSTEM, AND A SEMICONDUCTOR INTEGRATED CIRCUIT

CROSS REFERENCE TO RELATED APPLICATIONS AND INCORPORATION BY REFERENCE

This application is based upon and claims the benefit of priority from the prior Japanese Patent Applications No. P2005-041158, filed on Feb. 17, 2005, the entire contents of which are incorporated herein by reference.

BACKGROUND OF THE INVENTION

1. Field of the Invention

The present invention relates to a semiconductor integrated circuit and, more specifically, to a semiconductor integrated circuit and a method of manufacturing a semiconductor integrated circuit including a plurality of metal layers connected with a plurality of vias.

2. Description of the Related Art

With movement toward further miniaturization of a semiconductor integrated circuit, it has become more difficult to form wiring shapes for the connection of elements as designed. In particular, in an advanced semiconductor integrated circuit including a multi-layer interconnection, a terminal end of a wiring in one layer in the multi-layer interconnection is sometimes formed shorter than a predetermined shape, owing to an optical proximity effect (OPE) or the like. As a result, a phenomenon (shortening) occurs in which the wiring does not reach a position of a via hole, thereby causing a connection failure.

An increase of an aspect ratio of a via has also been advanced by the requirement for miniaturization of the wiring, and it has become more difficult to bury a via plug in the via hole. When the via is not formed at a desired position, reliability and yield of the circuit are decreased. Therefore, methods for decreasing a via defect and for improving the reliability and the yield have been examined.

To decrease occurrence of the shortening of the wiring, a wiring region in which the via is provided is preliminarily elongated or expanded. To improve low reliability owing to the via defect, upper and lower wiring layers are connected with two vias (double-cut vias) in place of one via (single-cut via).

However, in the multi-layer interconnection in which preferential directions of the wiring are set alternately in the vertical and horizontal directions, the wiring is extended in an orientation different from the preferential direction in each wiring layer in order to arrange the two vias connecting the upper and lower wiring layers to each other. Accordingly, another wiring pattern extending in the preferential direction cannot be disposed in the periphery of a portion to which the wiring is extended, so as to be adjacent thereto, and wiring efficiency is decreased.

In particular, in a design tool for designing the wiring by taking grids as references, the extended wiring portion is laid against the preferential direction, and thus grids in the preferential direction, in which it should have been possible to lay the wiring, are substantially occupied. Accordingly, the wiring efficiency is decreased. As a result, it becomes difficult to increase the density of the circuit, causing an increase of chip size.

SUMMARY OF THE INVENTION

An aspect of the present invention is directed to a method for manufacturing a semiconductor integrated circuit using layout data designed by a sequence of processes. The sequence of processes disposes a lower-layer wiring pattern on a lower-layer wiring layer implemented in a graphics image space, and an upper-layer wiring pattern perpendicular to the lower-layer wiring pattern on an upper-layer wiring layer implemented in the graphics image space; provides a detour pattern including a first detour pattern connected to the upper-layer wiring pattern in a direction perpendicular to a longitudinal direction of the upper-layer wiring pattern and a second detour pattern connected to the first detour pattern in a direction perpendicular to a longitudinal direction of the first detour pattern; provides a plurality of via patterns, connecting the lower-layer and upper-layer wiring patterns at an intersection of the lower-layer and upper-layer wiring patterns and on the detour pattern; and forms a via cell pattern based on the detour pattern and the via patterns.

Another aspect of the present invention is directed to a program configured to be executed by a computer for executing an application on a computer automated design system. The program carries out disposing a lower-layer wiring pattern on a lower-layer wiring layer implemented in a graphics image space, and an upper-layer wiring pattern perpendicular to the lower-layer wiring pattern on an upper-layer wiring layer implemented in the graphics image space; providing a detour pattern including a first detour pattern connected to the upper-layer wiring pattern in a direction perpendicular to a longitudinal direction of the upper-layer wiring pattern and a second detour pattern connected to the first detour pattern in a direction perpendicular to a longitudinal direction of the first detour pattern; providing a plurality of via patterns connecting the lower-layer and upper-layer wiring patterns at an intersection of the lower-layer and upper-layer wiring patterns and on the detour pattern; and forming a via cell pattern based on the detour pattern and the via patterns.

Still another aspect of the present invention is directed to a semiconductor integrated circuit. The semiconductor integrated circuit comprises a lower-layer wiring; an interlayer insulating film provided on the lower-layer wiring; first and second vias provided in the interlayer insulating film and connected to the lower-layer wiring; an upper-layer wiring provided on the interlayer insulating film extending perpendicularly to a longitudinal direction of the lower-layer wiring, and intersecting with the lower-layer wiring at a position of the first via on a plane pattern; a first detour wiring connected to the upper-layer wiring and formed in a direction perpendicular to a longitudinal direction of the upper-layer wiring; and a second detour wiring connected to the first detour wiring and extending in a direction perpendicular to the first detour wiring, and intersecting with the lower-layer wiring at a position of the second via on the plane pattern.

BRIEF DESCRIPTION OF DRAWINGS

FIGS. 4-7 are CAD data illustrating a method of creating a via cell pattern as shown in FIG. 3A.

FIG. 11 is a flowchart illustrating the method of designing the semiconductor integrated circuit according to the embodiment of the present invention.

FIG. 12 is a flowchart illustrating the method of designing the semiconductor integrated circuit of step S15 in FIG. 11 according to the embodiment of the present invention.

FIGS. 29-33 are plan views illustrating via cell patterns designed by the design system according to the embodiment of the present invention.

DETAILED DESCRIPTION OF THE INVENTION

Figure 1:
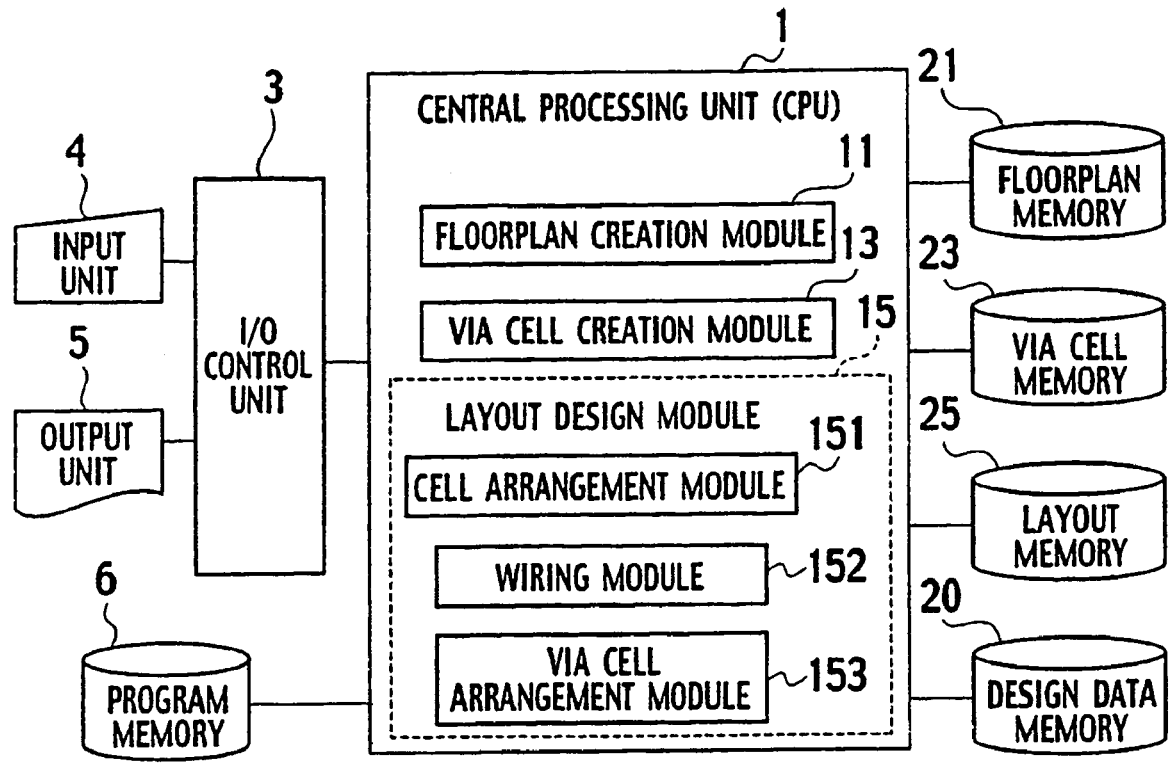
FIG. 1 is a block diagram illustrating a design system according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details.

As shown in FIG. 1, a design system according to an embodiment of the present invention includes a central processing unit (CPU) 1, which executes various arithmetic operations for a layout design and the like, an input and output control unit 3 connected to the CPU 1, an input unit 4 which inputs information such as data or instructions from an operator, and an output unit 5 which outputs a layout result and the like. The design system includes a program memory 6, which stores a layout program of the semiconductor integrated circuit, and the like, and a design data memory 20, a floorplan memory 21, a via cell memory 23, and a layout memory 25, which store design information necessary for the layout design of the semiconductor integrated circuit. The input unit 4 and the output unit 5 are connected to the input and output control unit 3.

The CPU 1 includes a floorplan creation module 11, a via cell creation module 13, and a layout design module 15. The floorplan creation module 11 creates a floorplan for arranging a logic cell, wiring and the like on a chip region set in a memory space of the design system. The floorplan memory 21 stores data of the floorplan created by the floorplan creation module 11.

Figure 2:
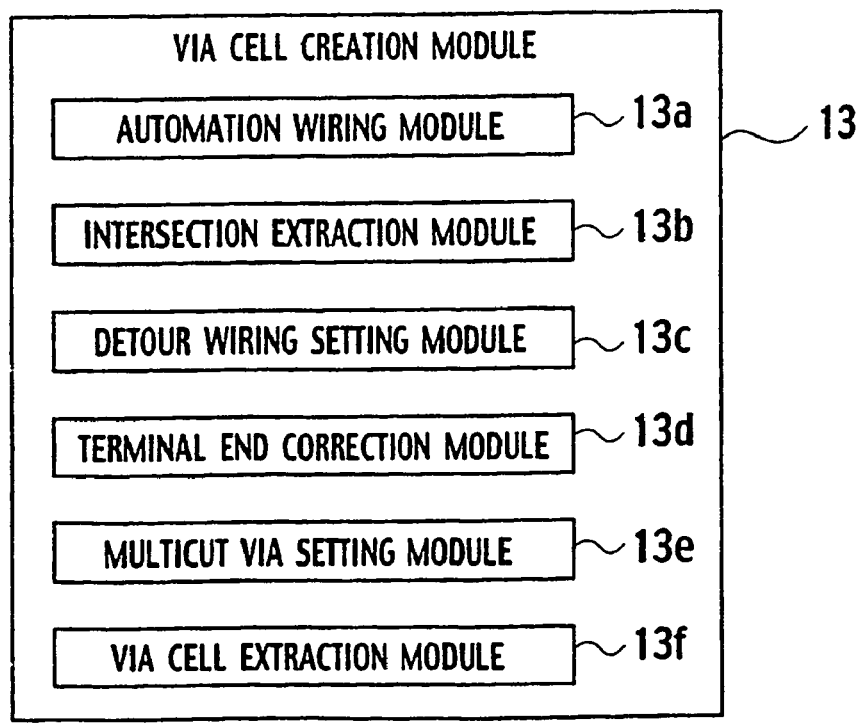
FIG. 2 is a block diagram illustrating a via cell creation module according to the embodiment of the present invention.

The via cell creation module 13 creates a list of via cell patterns 130a to 130d as shown in FIGS. 3A to 3D, each serving as a pattern of vias that connect upper and lower wiring layers to each other in the chip region. As shown in FIG. 2, the via cell creation module 13 further includes an automation wiring module 13a, an intersection extraction module 13b, a detour wiring setting module 13c, a terminal end correction module 13d, a multicut via setting module 13e, and a via cell extraction module 13f.

As shown in FIG. 4, the automation wiring module 13a arranges a lower-layer wiring pattern 31b and an upper-layer wiring pattern 41d on grids $X_1, X_2, \ldots, X_5$, set on the chip region, and grids $Y_1, Y_2, \ldots, Y_5$ perpendicular to the grids $X_1, X_2, \ldots, X_5$. The lower-layer wiring pattern 31b is disposed on the grid $X_3$ parallel to a preferential direction of the wiring layer in which the lower-layer wiring pattern 31b is wired. The upper-layer wiring pattern 41d is disposed on the grid $Y_4$ parallel to a preferential direction of the wiring layer in which the upper-layer wiring pattern 41d is wired.

The intersection extraction module 13b of FIG. 2 extracts an intersection P on a plane pattern of the lower-layer wiring pattern 31b and the upper-layer wiring pattern 41d. The detour wiring setting module 13c sets a detour pattern for arranging a plurality of vias near the intersection P of the lower-layer wiring pattern 31b and the upper-layer wiring pattern 41d.

Figure 5:
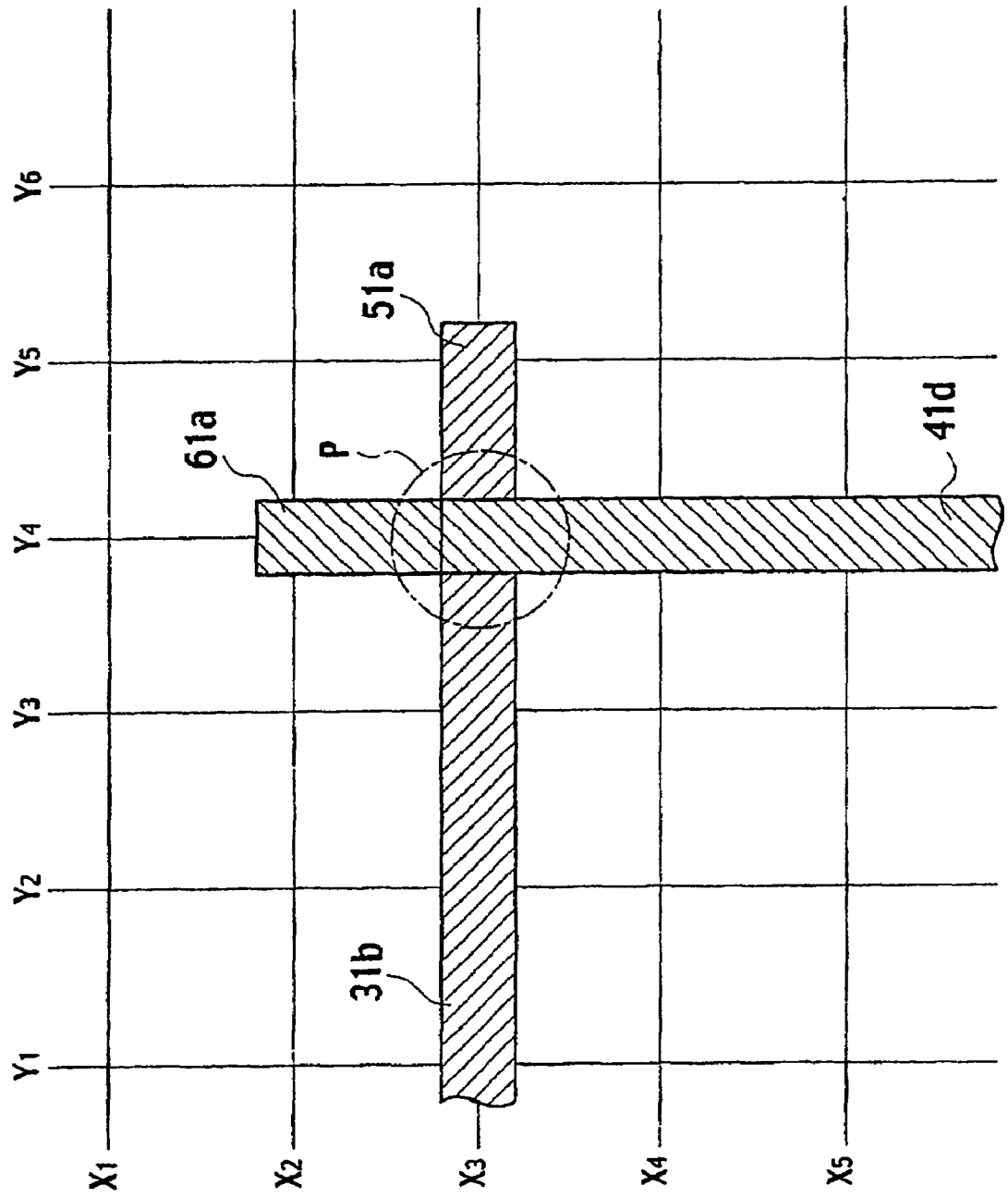

For example, as shown in FIG. 4, the intersection P is on the respective terminal ends of the lower-layer wiring pattern 31b and the upper-layer wiring pattern 41d. As shown in FIG. 5, the detour wiring setting module 13c arranges a lower-layer extended pattern 51a, formed by extending the lower-layer wiring pattern 31b from the intersection P in the longitudinal direction. The setting module 13 arranges an upper-layer extended pattern 61a, formed by extending the upper-layer wiring pattern 41d from the intersection P in the longitudinal direction. However, when the intersection P of the lower-layer wiring pattern 31b and the upper-layer wiring pattern 41d is not located on the respective terminal ends thereof, it is not necessary to arrange the lower-layer extended pattern 51a and the upper-layer extended pattern 61a.

Figure 6:
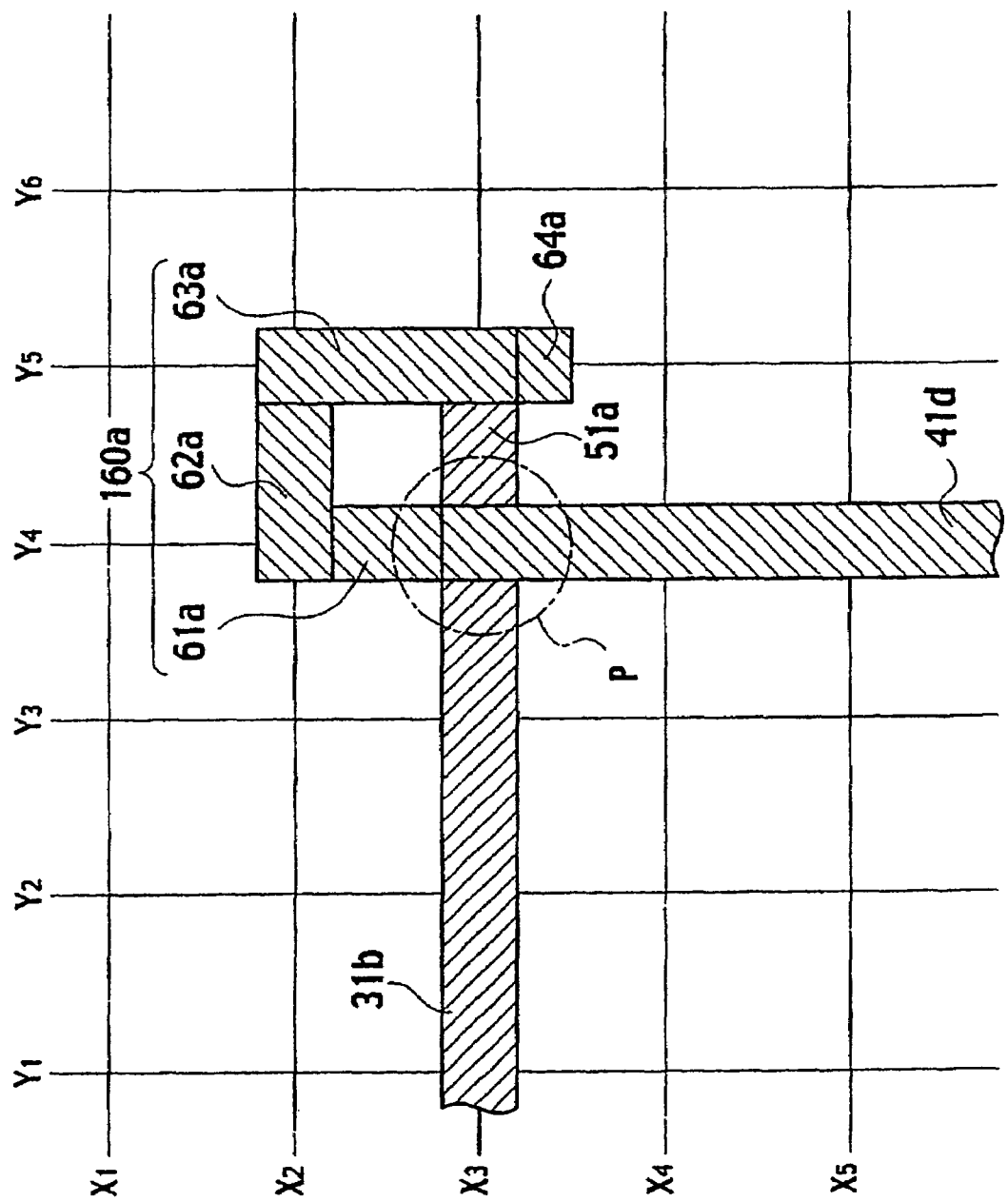

As shown in FIG. 6, the detour wiring setting module 13c positions a first detour pattern 62a in a direction perpendicular to the longitudinal direction of the upper-layer extended pattern 61a on an end of the upper-layer extended pattern 61a. On an end of the first detour pattern 62a, the detour wiring setting module 13c positions a second detour pattern 63a in a direction perpendicular to the longitudinal direction of the first detour pattern 62a. At this time, the detour wiring setting module 13c disposes the second detour pattern 63a so that a terminal end of the second detour pattern 63a can be overlapped with a terminal end of the lower-layer extended pattern 51a. By the upper-layer extended pattern 61a, the first detour pattern 62a, and the second detour pattern 63a, an upper-layer detour pattern 160a forming a "U-shape" is disposed on the plane pattern.

Figure 7:
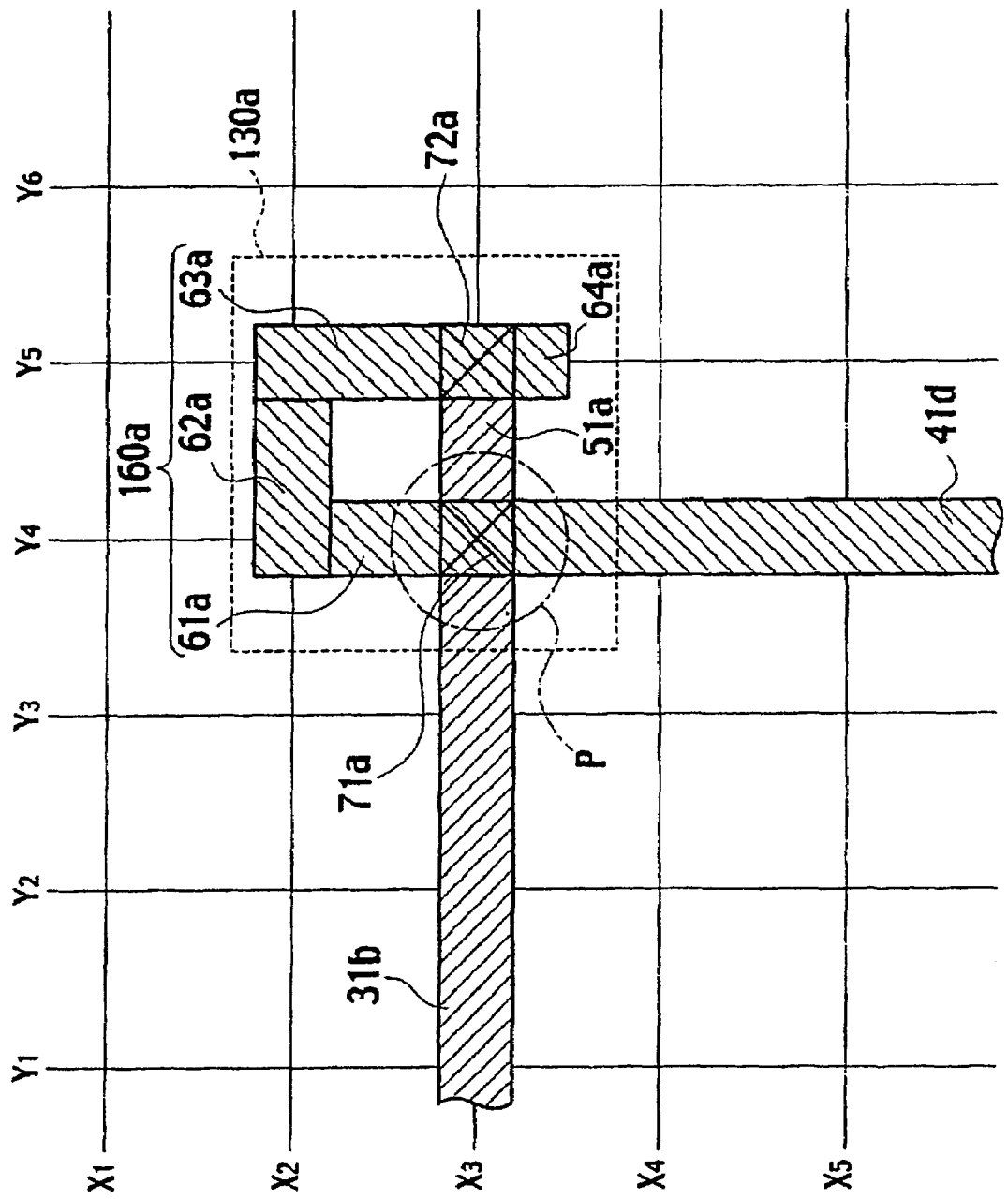

In order to prevent the terminal end of the wiring from being formed shorter than a predetermined length, the terminal end correction module 13d provides a terminal end correction pattern 64a on a terminal end of the upper-layer detour pattern 160a set by the detour wiring setting module 13c, that is, on a region where the second detour pattern 63a and the lower-layer extended pattern 51a intersect with each other in FIG. 6. As shown in FIG. 7, the multicut via setting module 13e sets a first via pattern 71a and a second via pattern 72a on the intersection P and an intersection of the second detour pattern 63a and the lower-layer extended pattern 51a, respectively. The via cell extraction module 13f extracts, as information on the via cell pattern 130a, shape information on the first via pattern 71a and the second via pattern 72a, and on the upper-layer detour pattern 160a and the lower-layer extended pattern 51a, which are on the peripheries thereof.

The layout design module 15 reads the information on the floorplan, which is stored in the floorplan memory 21, and automatically designs cells, wiring, and vias on the chip region. As shown in FIG. 1, the layout design module 15 includes a cell arrangement module 151, a wiring module 152, and a via cell arrangement module 153.

Figure 8:
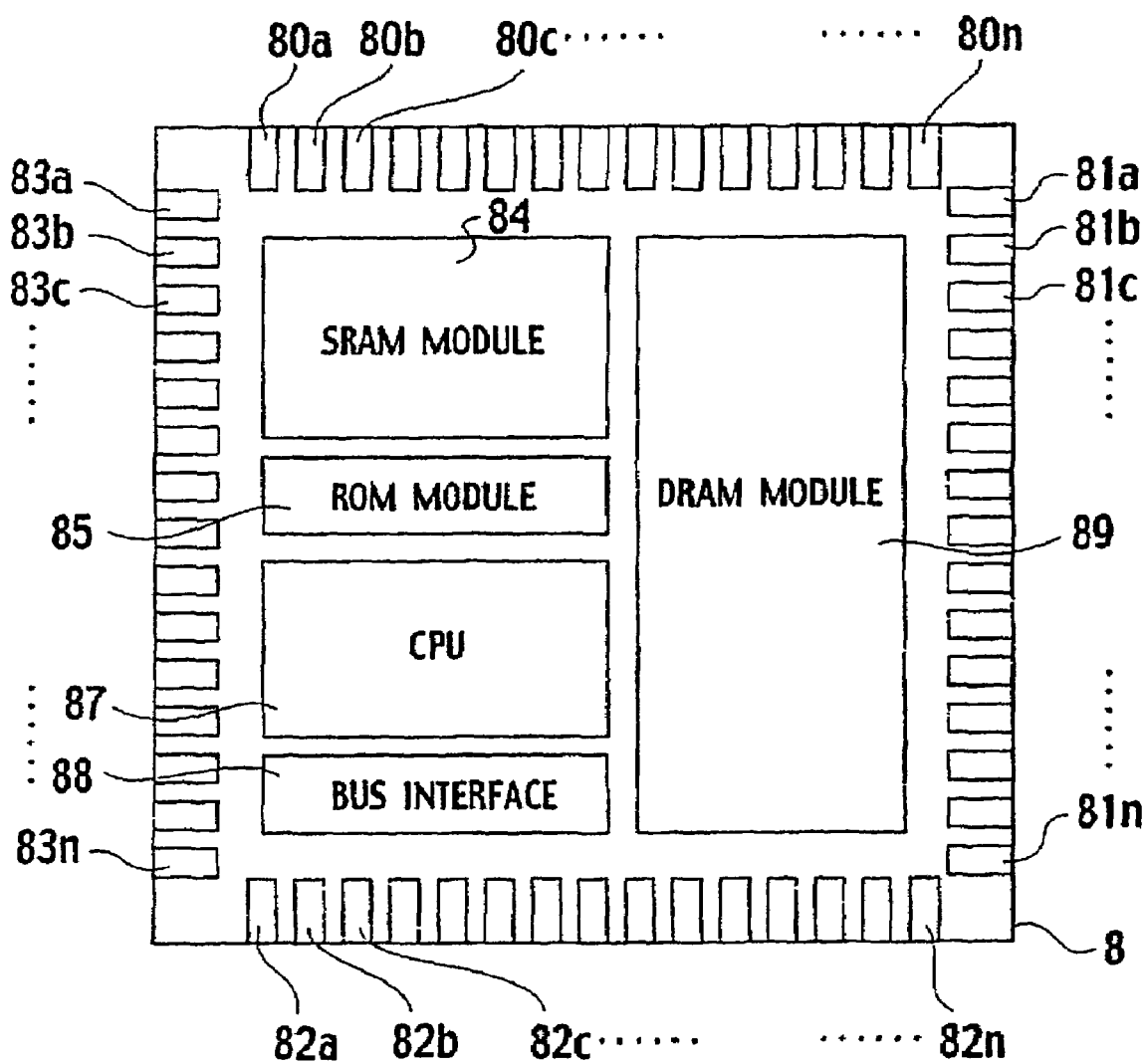
FIG. 8 is a plan view of a chip area, which is designed by the design system, according to the embodiment of the present invention.
Figure 9:
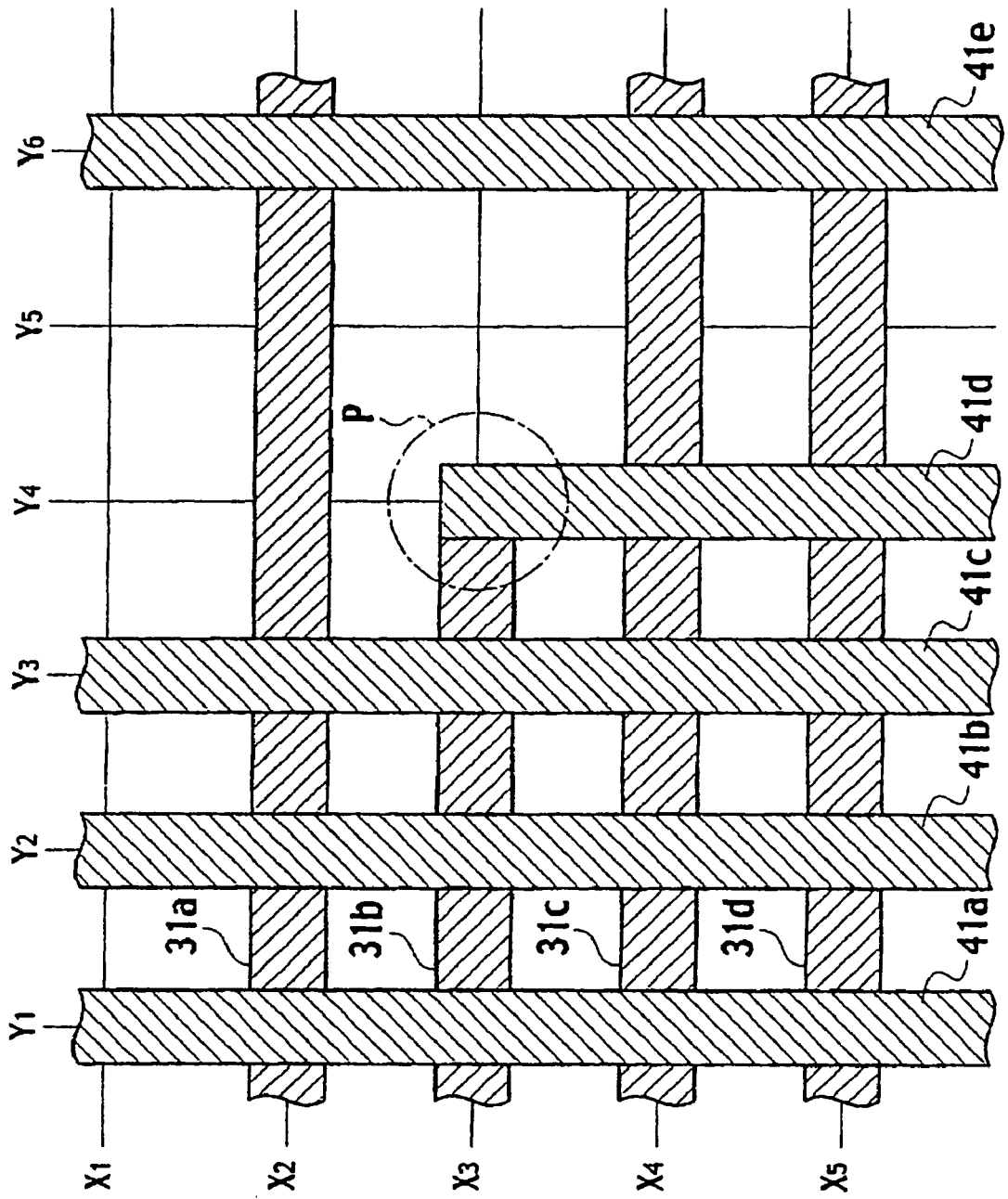
FIGS. 9 and 10 are CAD data illustrating a method of designing a semiconductor integrated circuit according to the embodiment of the present invention.

For example, as shown in FIG. 8, the cell arrangement module 151 individually arranges I/O cells 80a to 80n, 81a to 81n, 82a to 82n, and 83a to 83n on a peripheral region of the chip region, and arranges macro cells, logic cells and the like, such as an SRAM module 84, a ROM module 85, a CPU 87, a bus interface 88, a DRAM module 89, etc. on a region surrounded by the I/O cells 80a to 80n, 81a to 81n, 82a to 82n, and 83a to 83n. As shown in FIG. 9, the wiring module 152 arranges lower-layer wiring patterns 31a to 31d extending parallel to one another along the grids $X_2, X_3, \ldots, X_5$, respectively, at desired positions of the chip region shown in FIG. 8. The wiring module 152 arranges upper-layer wiring patterns 41a to 41e extending parallel to one another along the grids $Y_1$ to $Y_3$ and $Y_6$, respectively, on the lower-layer wiring patterns 31a to 31d.

The via cell arrangement module 153 extracts the intersection P of the lower-layer wiring patterns 31a to 31d and the upper-layer wiring patterns 41a to 41e, which are arranged by the wiring module 152, extracts information on the via cell pattern 130a adapted to a diagram environment in the periphery of the intersection P from the via cell memory 23, and disposes the via cell pattern 130a on the intersection P. The layout memory 25 of FIG. 1 stores information on the layout arranged by the cell arrangement module 151, the wiring module 152, and the via cell arrangement module 153.

The input unit 4 includes a keyboard, a mouse, a light pen, a flexible disk drive, or the like. It is possible for a layout operator to designate input and output data and to set numeric values and the like necessary for the automation design through the input unit 4. Moreover, through the input unit 4, it is also possible to set layout parameters, such as formats of the output data, and to input instructions for execution or suspension of the arithmetic processing, and the like. The output unit 5 includes display and printer devices, and the like, and displays the input and output data, a layout result, and the like. The program memory 6 stores the input and output data, the layout parameters, histories thereof, data on the manner of operation, and the like.

An example of a method of designing the semiconductor integrated circuit according to this embodiment will be described below with reference to flowcharts shown in FIGS. 11 and 12.

In Step S11, the floorplan creation module 11 reads design information on the semiconductor integrated circuit, which is stored in the design data memory 20, and creates the floorplan for arranging the logic cell, the wiring and the like on the chip region. Then, the floorplan creation module 11 stores the created floorplan in the floorplan memory 21.

In Step S13, the via cell creation module 13 reads the design information on the semiconductor integrated circuit, which is stored in the design data memory 20. The via cell creation module 13 creates a list of the via cell patterns 130a to 130d as illustrated in FIGS. 3A to 3D for connecting the upper and lower wiring layers to each other by the plurality of vias, based on the read design information, and stores the list in the via cell storage module 23. A method of creating the list of the via cell patterns 130a to 130d will be described later in detail.

In Step S15, the layout design module 15 reads the design information stored in the design data memory 20 and the information on the floorplan stored in the floorplan memory 21, and designs the wiring layout on the chip region. In Step S151, the cell arrangement module 151 reads the design information stored in the design data memory 20 and the information on the floorplan stored in the floorplan memory 21, and, as shown in FIG. 8, arranges the I/O cells 80a to 80n, 81a to 81n, 82a to 82n, and 83a to 83n, and the macro cells, the logic cells and the like, such as the SRAM module 84, the ROM module 85, the CPU 87, the bus interface 88, and the DRAM module 89 on the chip region. The cell arrangement module 151 stores the obtained layout information in the layout memory 25.

In Step S153, the wiring module 152 reads the design information stored in the design data memory 20 and the information on the floorplan stored in the floorplan memory 21. As shown in FIG. 9, the wiring module 152 sets the grids $X_1, X_2, \ldots, X_5$ and the grids $Y_1, Y_2, \ldots, Y_5$ perpendicular to the grids $X_1, X_2, \ldots, X_5$ on the chip region. The wiring module 152 arranges the lower-layer wiring patterns 31a to 31d extending parallel to the grids $X_2, X_3, \ldots, X_5$, respectively, and on the lower-layer wiring patterns 31a to 31d, arranges the upper-layer wiring patterns 41a to 41e extending parallel to the grids $Y_1$ to $Y_3$ and $Y_6$, respectively. The wiring module 152 stores the information on the obtained wiring layout in the layout memory 25.

Figure 10:
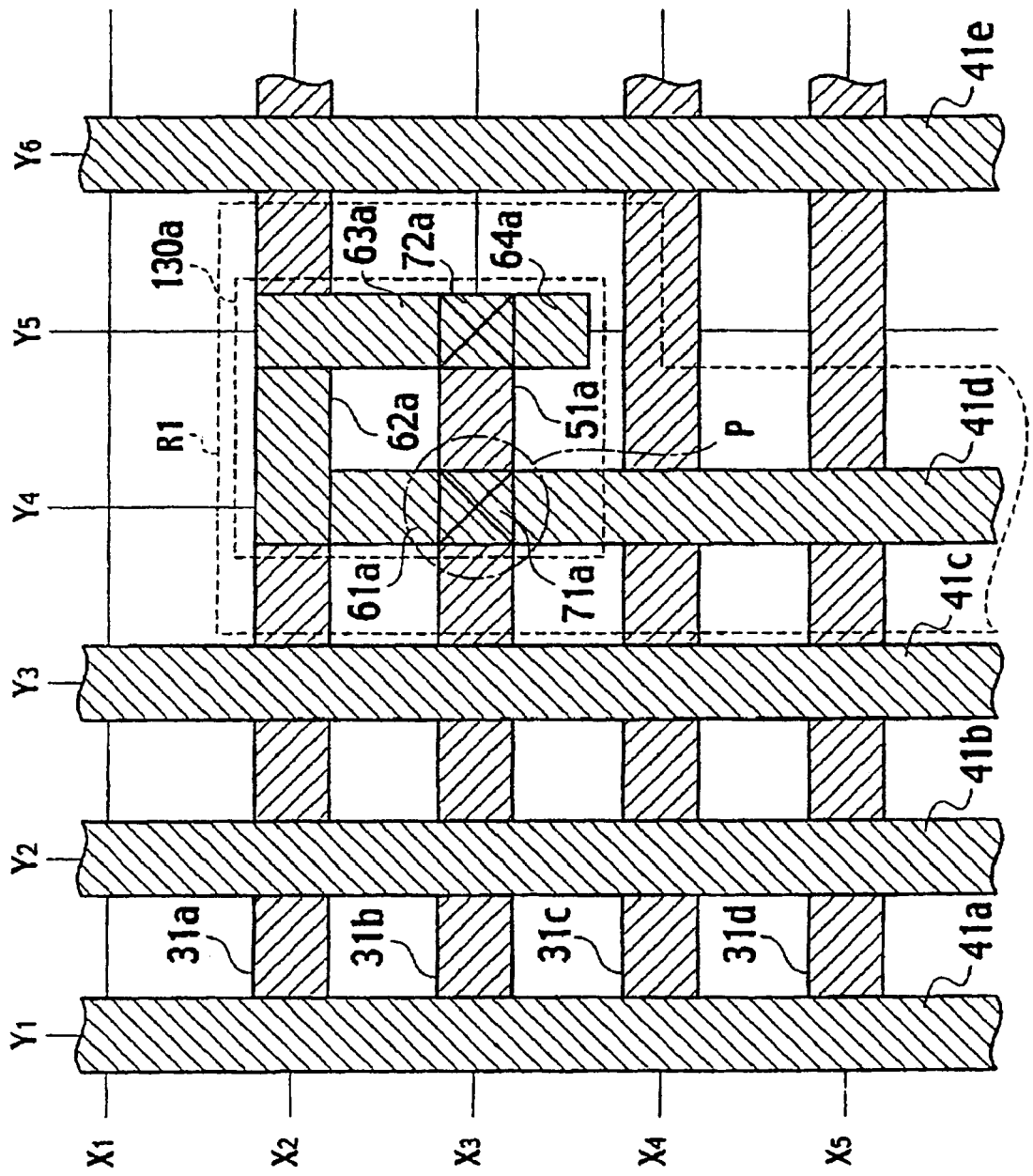

In Step S155, the via cell arrangement module 153 reads the design information, the floorplan information, and the wiring arrangement information stored in the layout memory 25, and, as shown in FIG. 9, extracts the intersection P of the lower-layer wiring patterns 31a to 31d and the upper-layer wiring patterns 41a to 41e. The via cell arrangement module 153 extracts the via cell pattern 130a from the via cell memory 23 which is most suitable for the geometrical environment in the periphery of the intersection P and, as shown in FIG. 10, arranges the via cell pattern 130a on the intersection P. The via cell arrangement module 153 stores the layout information on the obtained via cell pattern in the layout memory 25. In Step S17, the output unit 5 outputs the layout information on the cell, the wiring, and the via cell, which is stored in the layout memory 25, and then the designing of the semiconductor integrated circuit is accomplished.

Details of the method of creating the via cell pattern 130a, which is shown in Step S15, will be described below with reference to a flowchart shown in FIG. 12.

In Step S111 in FIG. 12, the automation wiring module 13a reads the design information stored in the design data memory 20, and, as shown in FIG. 4, sets the grids $X_1, X_2, \ldots, X_5$ and the grids $Y_1, Y_2, \ldots, Y_5$ perpendicular to the grids $X_1, X_2, \ldots, X_5$ on the chip region. The automation wiring module 13a disposes, on the grid $X_3$, the lower-layer wiring pattern 31b and sets a direction parallel to the grids $X_1$, $X_2, \ldots, X_5$ as the preferential direction thereof. The automation wiring module 13a disposes the upper-layer wiring pattern 41d on the grid $Y_4$ in which a direction parallel to the grids $Y_1, Y_2, \ldots, Y_5$ is the preferential direction thereof set on the lower-layer wiring pattern 31b. The automation wiring module 13a stores the arrangement information on the lower-layer wiring pattern 31d and the upper-layer wiring pattern 41d in the design data memory 20.

In Step S112, the intersection extraction module 132 reads the arrangement information on the lower-layer wiring pattern 31b and the upper-layer wiring pattern 41d, which is stored in the design data memory 20, and, as shown in FIG. 5, extracts the intersection P of the lower-layer wiring pattern 31b and the upper-layer wiring pattern 41d. The intersection extraction module 132 stores the information on the intersection P in the design data memory 20.

In Step S113, the detour wiring setting module 13c reads the design information and the arrangement information on the lower-layer wiring pattern 31b, the upper-layer wiring pattern 41d, and the intersection P stored in the design data memory 20 and creates the upper-layer detour pattern 160a for connecting the lower-layer wiring pattern 31b and the upper-layer wiring pattern 41d to each other by a plurality of vias. For example, as shown in FIG. 5, when the intersection P extracted by the intersection extraction module 13b is present on the respective terminal ends of the lower-layer wiring pattern 31b and the upper-layer wiring pattern 41d, the detour wiring setting module 13c individually arranges the lower-layer extended pattern 51a extending from the intersection P in the longitudinal direction of the lower-layer wiring pattern 31b and the upper-layer extended pattern 61a extending from the intersection P in the longitudinal direction of the upper-layer wiring pattern 41b. The detour wiring setting module 13c stores the information on the lower-layer extended pattern 51a and the upper-layer extended pattern 61a in the design data memory 20.

Moreover, as shown in FIG. 6, the detour wiring setting module 13c disposes the first detour pattern 62a in the direction perpendicular to the upper-layer extended pattern 61a on the end of the upper-layer extended pattern 61a. On the end of the first detour pattern 62a, the detour wiring setting module 13c disposes the second detour pattern 63a in the direction perpendicular to the first detour pattern 62a. At this time, the detour wiring setting module 13c disposes the second detour pattern 63a so that the terminal end of the second detour pattern 63a can be connected to the lower-layer extended pattern 51a on the plane pattern. As a result, the upper-layer extended pattern 61a, the first detour pattern 62a, and the second detour pattern 63a form the "U-shape" of the upper-layer detour pattern 160a on the plane pattern. The detour wiring setting module 13c stores the information on the upper-layer detour pattern 160a and the lower-layer extended pattern 51a in the design data memory 20.

In Step S114, the terminal end correction module 13d reads the design information and the arrangement information on the lower-layer extended pattern 51a, the upper-layer detour pattern 160a and the like, which are stored in the design data memory 20, extracts the terminal end of the upper-layer detour pattern 160a, that is, the terminal end of the second detour pattern 63a, and disposes the terminal end correction pattern 64a in the longitudinal direction of the terminal end. The terminal end correction module 13d stores the disposition information on the terminal end correction pattern 64a in the design data memory 20.

In Step S115, as shown in FIG. 7, the multicut via setting module 13e reads the design information and the layout information, which are stored in the design data memory 20, and sets the first via pattern 71a and the second via pattern 72a at the intersection P of the lower-layer wiring pattern 31b and the upper-layer wiring pattern 41d and the terminal end of the second detour pattern 63a, respectively. The multicut via setting module 13e stores the layout information set thereby in the design data memory 20.

In Step S116, the via cell extraction module 13f reads the design information and the layout information, which are stored in the design data memory 20, and extracts the information on the first via pattern 71a and the second via pattern 72a, and the information on the upper-layer detour pattern 160a and the lower-layer extended pattern 51a which are present on the peripheries of the first and second via patterns 71a and 71b. The via cell extraction module 13f regards such extracted information as the shape information of the via cell pattern 130a, and stores the extracted information in the via cell memory 23.

In Step S117, based on the design information stored in the design data memory 20, the via cell arrangement module 153 determines whether or not the list of the shape information of the via cells has been extracted for all wiring structures that can be formed on the chip region. When the list of the shape of the via cells has been extracted entirely, the extraction of the via cell patterns 130a to 130d is finished. When the list has not been entirely extracted, the method proceeds to Step S112, where unextracted design information and floorplan information are read, and the intersection P is thus extracted.

In accordance with the design method according to the embodiment, the via cell creation module 13 creates, in advance, the list of the shape data of the via cells for arranging the plurality of vias on the chip region, and stores the list in the via cell memory 23. Therefore, in order to connect the upper and lower wiring layers to each other by the plurality of vias, the information on the via cells just needs to be extracted and the via cells just need to be arranged, based on the diagram environment in the periphery of the target portion. Accordingly, the design process can be accelerated.

Moreover, the plurality of vias (first and second via patterns 71a and 71b) are used for connecting the lower-layer wiring pattern 31b and the upper-layer wiring pattern 41d to each other. Accordingly, even when a defect and the like occur in one of the vias while manufacturing the semiconductor integrated circuit, the electrical connection can be maintained by the other via. As a result, it is possible to design a semiconductor integrated circuit in which reliability and yield are improved. However, when it is desired for the upper and lower wiring layers to be connected to each other by one via, information for disposing only one via needs to be stored in the via cell memory 23. Therefore, it is also possible to provide one via of a location where it is not necessary to connect the upper and lower wiring layers to each other by the plurality of vias.

As shown in FIG. 10, the terminal end correction pattern 64a for preventing shortening of the wiring is not extended in the orientation different from the preferential direction, but is disposed on and along the grid $Y_3$ parallel to the preferential direction of the upper-layer wiring pattern 41d. A region R1 where the wiring is prohibited from being laid, which occurs in the case of disposing the upper-layer wiring pattern 41d, does not extend to the grid $Y_3$ or the grid $Y_6$, and accordingly, the upper-layer wiring pattern 41c and the upper-layer wiring pattern 41e can be arranged on the grid $Y_3$ and the grid $Y_6$. Therefore, in accordance with the design method according to this embodiment, it is possible to form a layout in which the upper-layer wiring pattern 41c and the upper-layer wiring pattern 41*e* are adjacent to the upper-layer wiring pattern 41*d*, without being subjected to arrangement limitations caused by positioning of the terminal end correction pattern 64*a*. As a result, in comparison with a layout that does not use the upper-layer detour pattern 160*a*, possible wiring patterns can be improved by approximately 30% to 40%, and it is possible to design a semiconductor integrated circuit in which density is increased.

Figure 13:
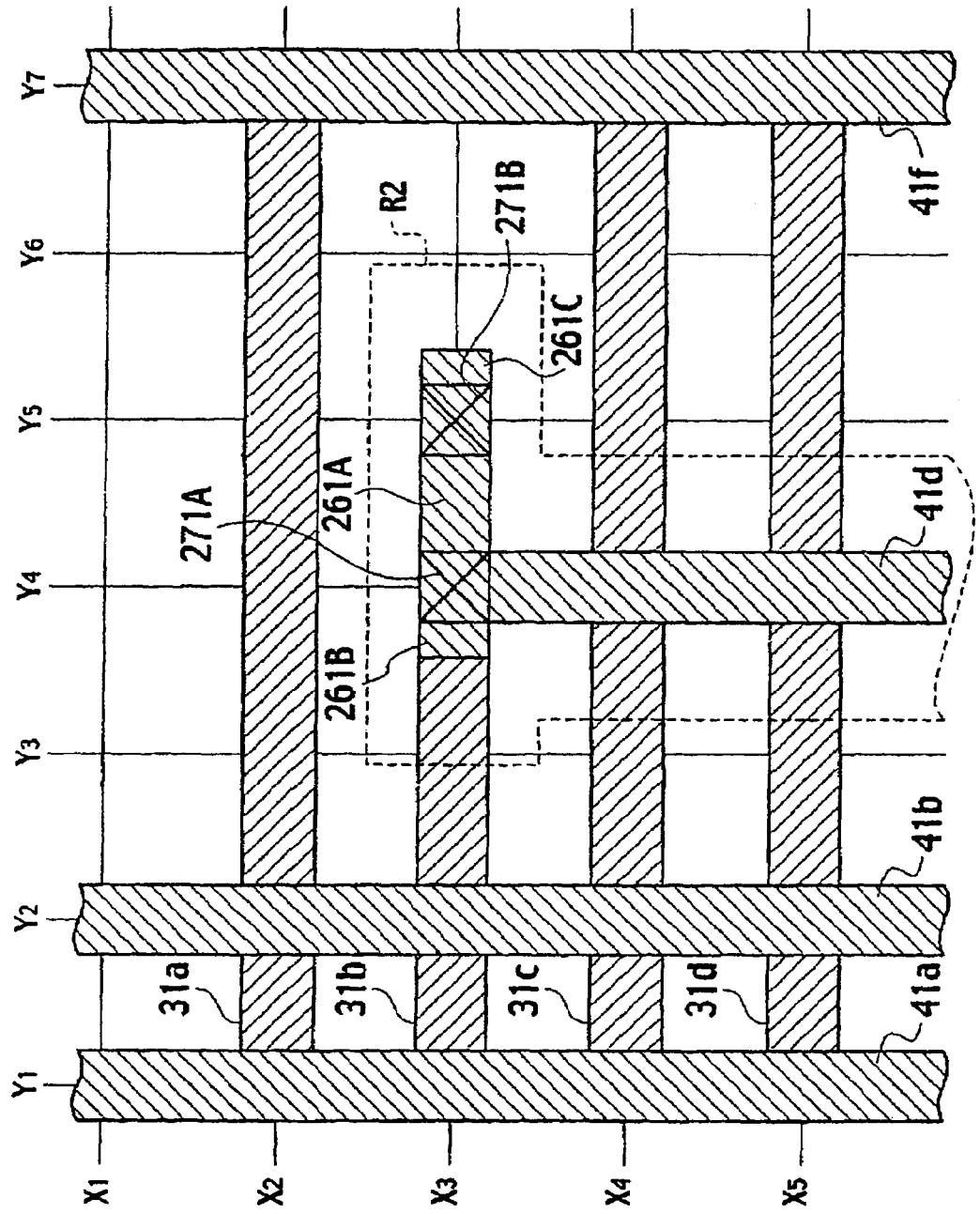
FIGS. 13 and 14 are CAD data illustrating comparative examples according to the embodiment of the present invention.

As a comparative example, a layout as generally designed at present is shown in FIG. 13. When an extended pattern 261A is connected to the upper-layer wiring pattern 41*d* in an orientation perpendicular to the longitudinal direction thereof, both of terminal end correction patterns 261B and 261C, present on both ends of the extended pattern 261A, are set in an orientation different from the preferential direction of the upper-layer wiring pattern 41*d*. As a result, a terminal end of the terminal end correction pattern 261B approaches the grid $Y_3$, and a terminal end of the terminal end correction pattern 261C approaches the grid $Y_6$. Accordingly, a region R2 where the wiring is prohibited from being laid extends to the grids $Y_3$ and $Y_6$. It is impossible to lay new wiring on the grids $Y_3$ and $Y_6$, and wiring efficiency is decreased in comparison with the layout shown in FIG. 10.

Figure 14:
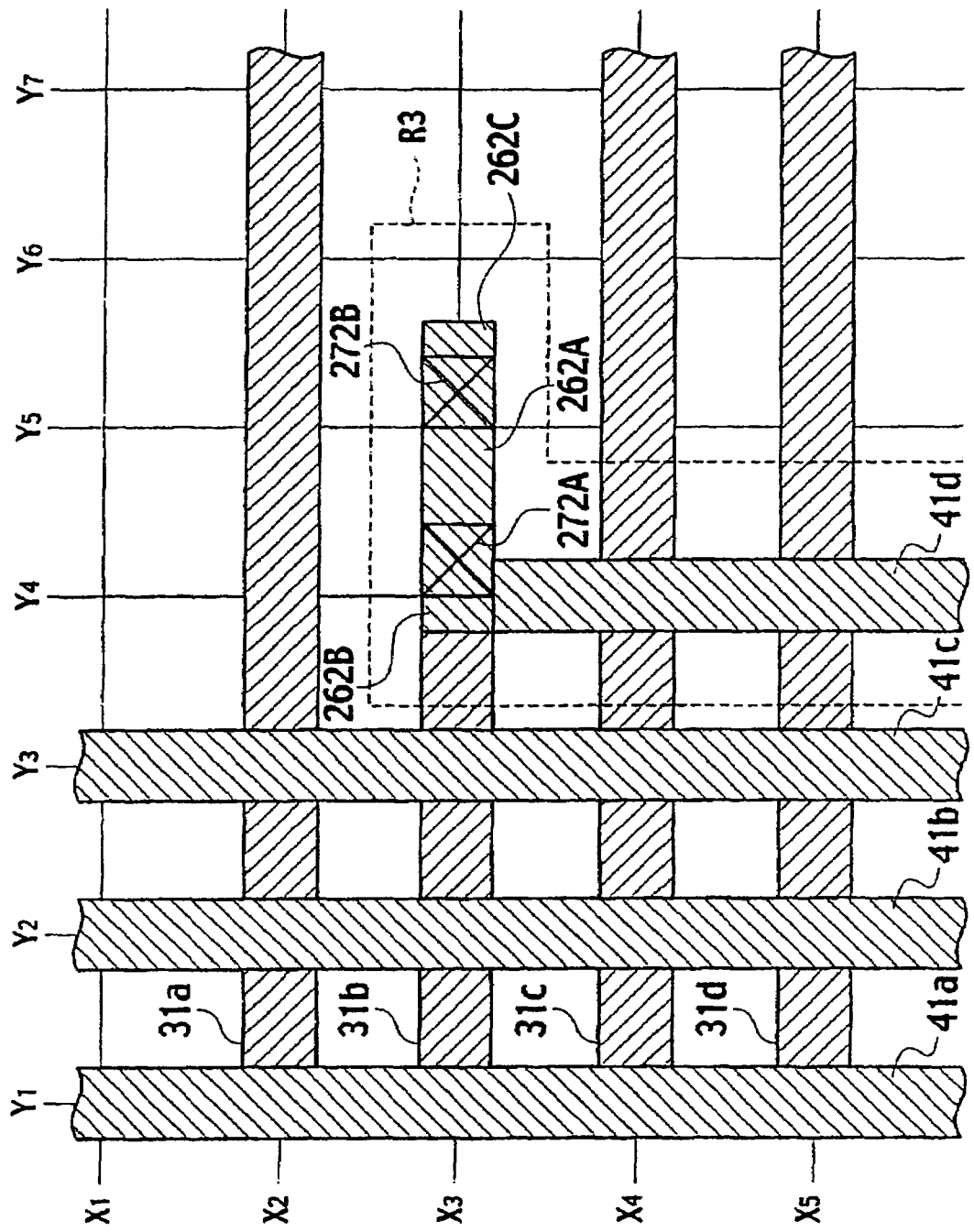

As shown in FIG. 14, if an end of a terminal end correction pattern 262B, present on a terminal end of an extended pattern 262A, is disposed so as to be overlapped with the end of the upper-layer wiring pattern 41*d* on the plane pattern, a region R3 where the wiring is prohibited from being laid does not extend to the grid $Y_3$. Therefore, the upper-layer wiring pattern 41*c* can be disposed adjacent to the upper-layer wiring pattern 41*d*. However, the region R3 where the wiring is prohibited from being laid extends to the grid $Y_6$. Accordingly, it is impossible to lay new wiring on the grid $Y_6$, and the wiring efficiency is reduced in comparison with the case of FIG. 10. Moreover, in the case of the layout shown in FIG. 14, the via patterns 272A and 272B are not fully set on the grids $X_1, X_2, \ldots, X_5$ and the grids $Y_1, Y_2, \ldots, Y_5$, so that the design process also becomes complicated. Hence, the design method of the semiconductor integrated circuit according to this embodiment can provide a semiconductor integrated circuit with the density increased in comparison with the comparative examples shown in FIG. 13 and FIG. 14.

Figure 15:
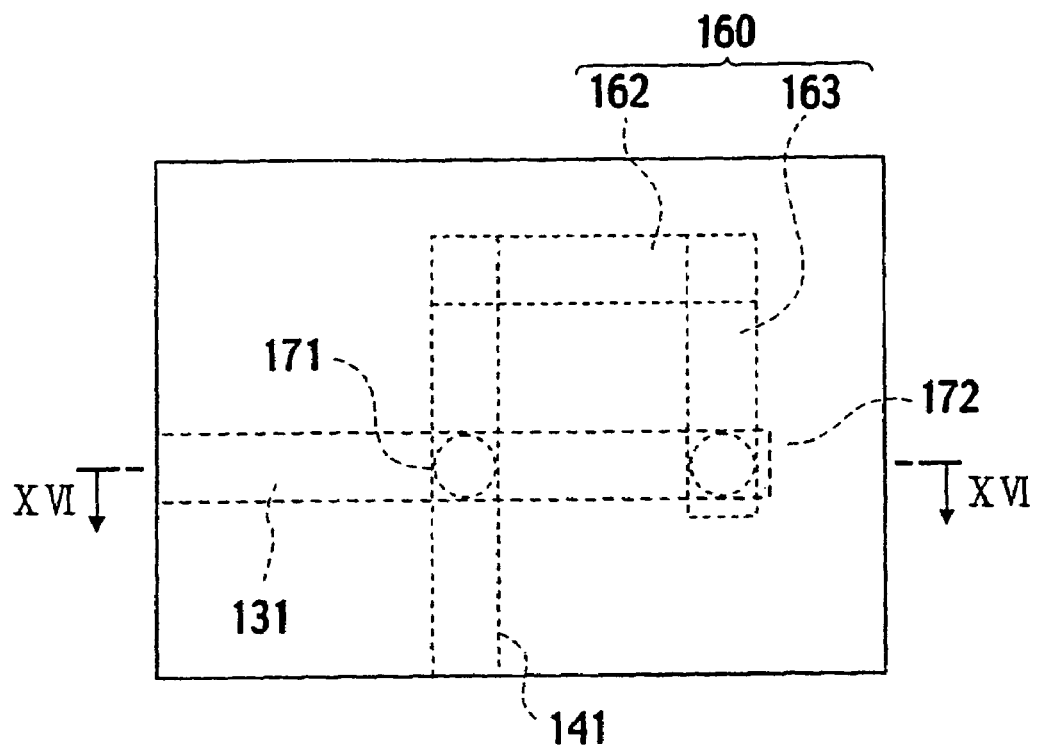
FIG. 15 is a plan view of the semiconductor integrated circuit according to the embodiment of the present invention.
Figure 16:
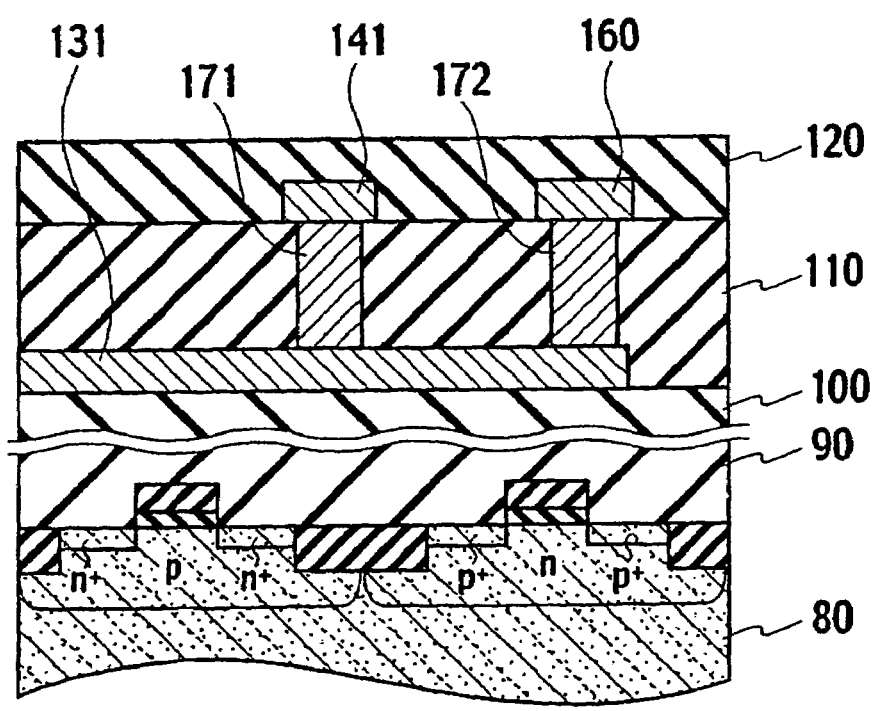
FIG. 16 is a cross-sectional view taken on line XVI-XVI in FIG. 15 according to the embodiment of the present invention.

An example of the multi-layer interconnection of the semiconductor integrated circuit according to the embodiment is shown in FIGS. 15 and 16. The semiconductor integrated circuit shown in FIGS. 15 and 16 is manufactured by applying a plurality of reticle sets to the layout shown in FIG. 5 while a pattern generator or the like is used to draw such reticle sets.

As shown in FIG. 16, the semiconductor integrated circuit includes a semiconductor substrate 80, and a first interlayer insulating film 90 disposed on the semiconductor substrate 80. Note that, more generally, the first interlayer insulating film 90 is a (k−2)-th interlayer insulating film (K=3). A (k−1)-th interlayer insulating film 100 is disposed on the first interlayer insulating film 90. Lower ((k−1)-th)-layer wiring 131 is disposed on the (k−1)-th interlayer insulating film 100. A k-th interlayer insulating film 110 is disposed on the (k−1)-th interlayer insulating film 100 and the lower-layer wiring 131. First and second vias 171 and 172 connected to the lower-layer wiring 131 are buried in the k-th interlayer insulating film 110. On the k-th interlayer insulating film 110, upper ((k)-th)-layer wiring 141 connected to the first via 171 and upper-layer detour wiring 160 connected to the second via 172 are arranged.

As shown in FIG. 15, the upper-layer wiring 141 extendes in a direction perpendicular to the longitudinal direction of the lower-layer wiring 131, and intersects with the lower-layer wiring 131 at a position of the first via 171 on a plane pattern. The upper-layer detour wiring 160 includes a first detour portion (first detour wiring) 162, and a second detour portion (second detour wiring) 163. The first detour portion 162 is provided at an end of the upper-layer wiring 141 in a direction perpendicular to the longitudinal direction of the upper-layer wiring 141. The second detour portion 163 is connected to the first detour portion 162, extending in a direction perpendicular to the longitudinal direction of the first detour portion 162, and intersects with the lower-layer wiring 131 at a position of the second via 172 on the plane pattern.

In accordance with the semiconductor integrated circuit according to this embodiment, the vias (first and second vias 171 and 172) are arranged in order to connect the lower-layer wiring 131 and the upper-layer wiring 141 to each other. Accordingly, even when a defect and the like occurs in one of the vias while manufacturing the semiconductor integrated circuit, the electrical connection can be maintained by the other via. As a result, a semiconductor integrated circuit in which reliability and yield are improved can be provided. Moreover, the second detour portion 163, serving as a terminal end of the detour wiring 160, is extended parallel to the longitudinal direction of the upper-layer wiring 141, and accordingly, new wiring can be laid adjacent to the upper-layer wiring 141 and the detour wiring 160. As a result, the density of the semiconductor integrated circuit can be increased and miniaturization can be achieved.

A manufacturing method of the semiconductor integrated circuit according to the embodiment will be described below. The manufacturing method of the semiconductor integrated circuit is an example, and it is a matter of course that the semiconductor integrated circuit can be manufactured by other various manufacturing methods including a modification of the manufacturing method of the embodiment.

Figure 17:
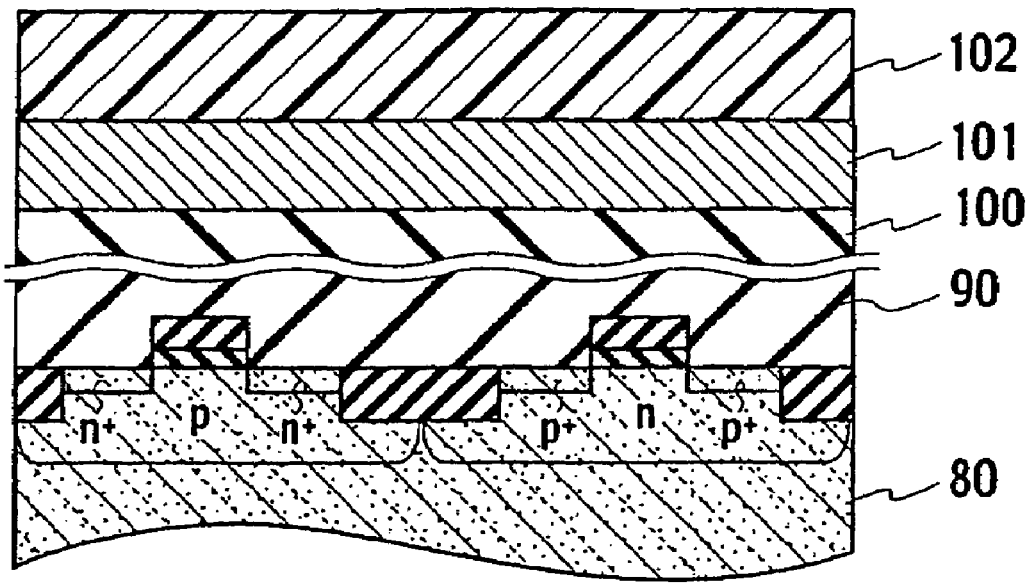
FIGS. 17 and 18 are cross-sectional views illustrating the method of manufacturing a semiconductor integrated circuit according to the embodiment of the present invention.

As shown in FIG. 17, the first interlayer insulating film 90, such as a silicon oxide film ($SiO_2$ film), is deposited on the semiconductor substrate 80, on which a plurality of elements are formed, by chemical vapor deposition (CVD), physical vapor deposition (PVD), or the like. A surface of the first interlayer insulating film 90 is planarized by chemical mechanical polishing (CMP). On the first interlayer insulating film 90, the (k−1)-th interlayer insulating film 100 is deposited by CVD, PVD, or the like, and a surface thereof is planarized. On the (k−1)-th interlayer insulating film 100, a conductive thin film 101 is deposited, and then planarized. A photoresist film 102 is applied on the conductive thin film 101.

Figure 18:
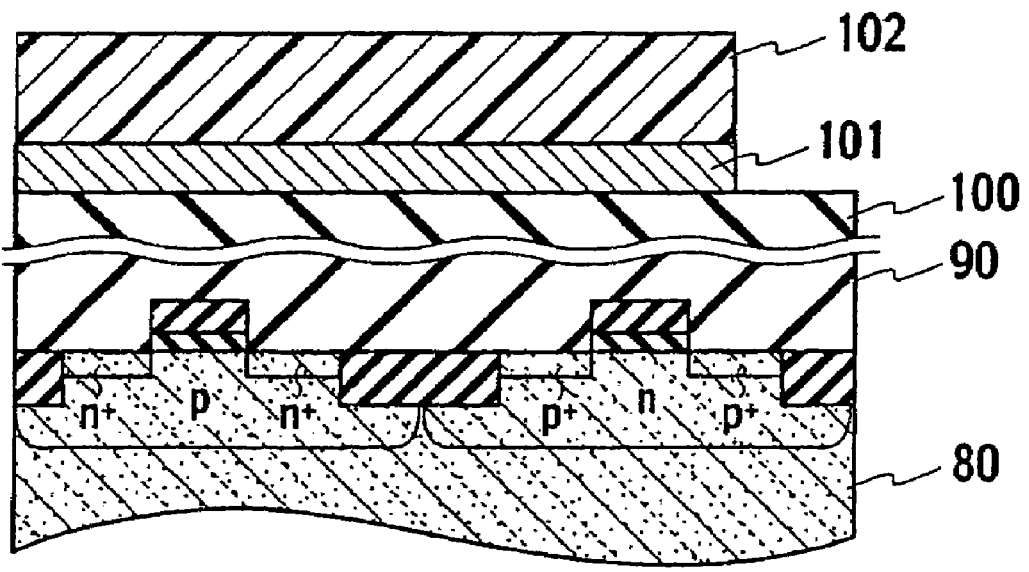
Figure 19:
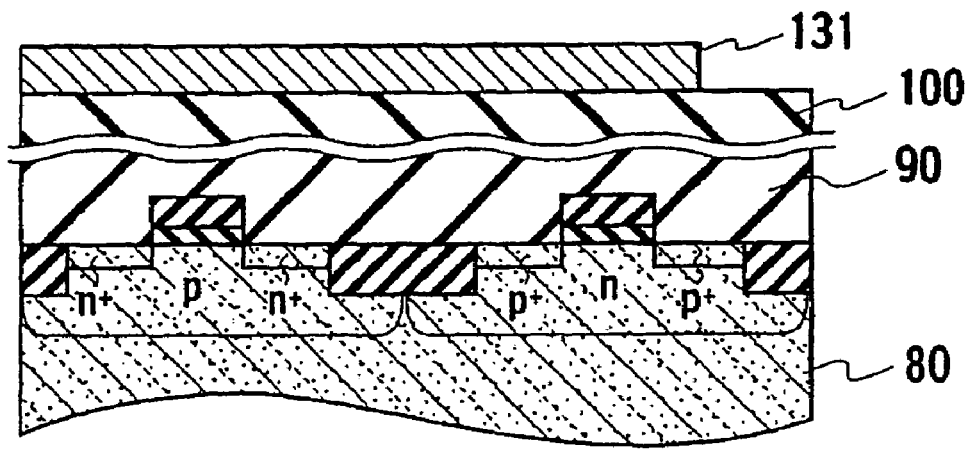
FIG. 19 is a cross-sectional view taken on line XIX-XIX in FIG. 20.
Figure 20:
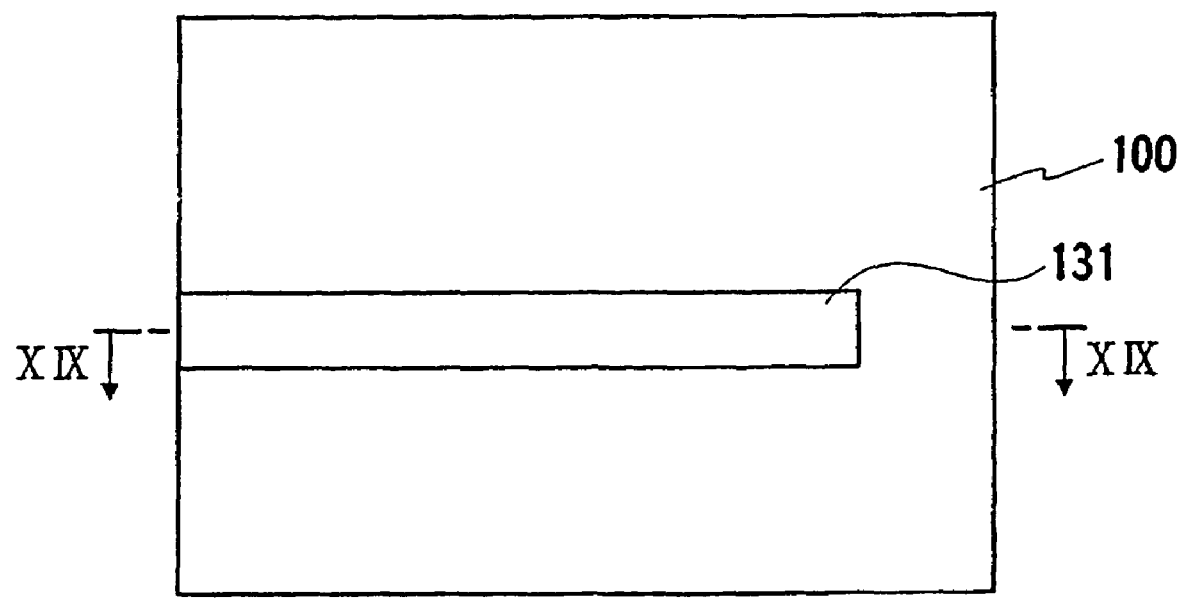
FIG. 20 is a plan view of the semiconductor integrated circuit according to the embodiment of the present invention.

The semiconductor substrate 80 shown in FIG. 17 is positioned on an exposure stage such as a stepper. The photoresist film 102 is exposed and developed by using a reticle made in accordance with the layout shown in FIG. 5, and delineated on the conductive thin film 101. By using the delineated photoresist film 102 as a mask, a part of the conductive thin film 101 is selectively stripped by radical ion etching (RIE) or the like as shown in FIG. 18. By removing the photoresist film 102, the lower ((k−1)-th)-layer wiring 131 is formed on the (k−1)-th interlayer insulating film 100 as show in a cross-sectional view of FIG. 19 and a plan view of FIG. 20.

Figure 21:
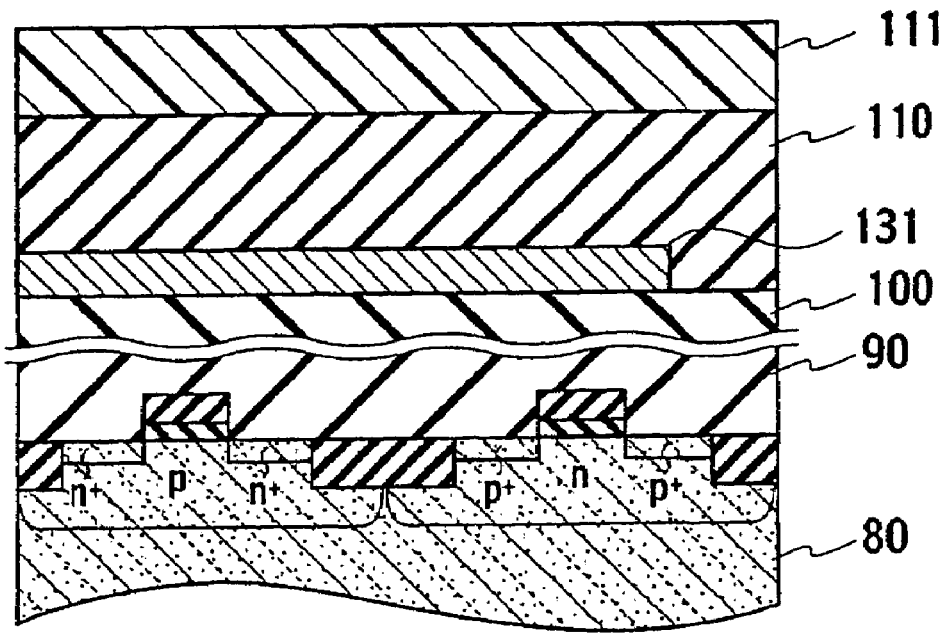
FIGS. 21 and 22 are cross-sectional views illustrating the method of manufacturing the semiconductor integrated circuit according to the embodiment of the present invention.
Figure 22:
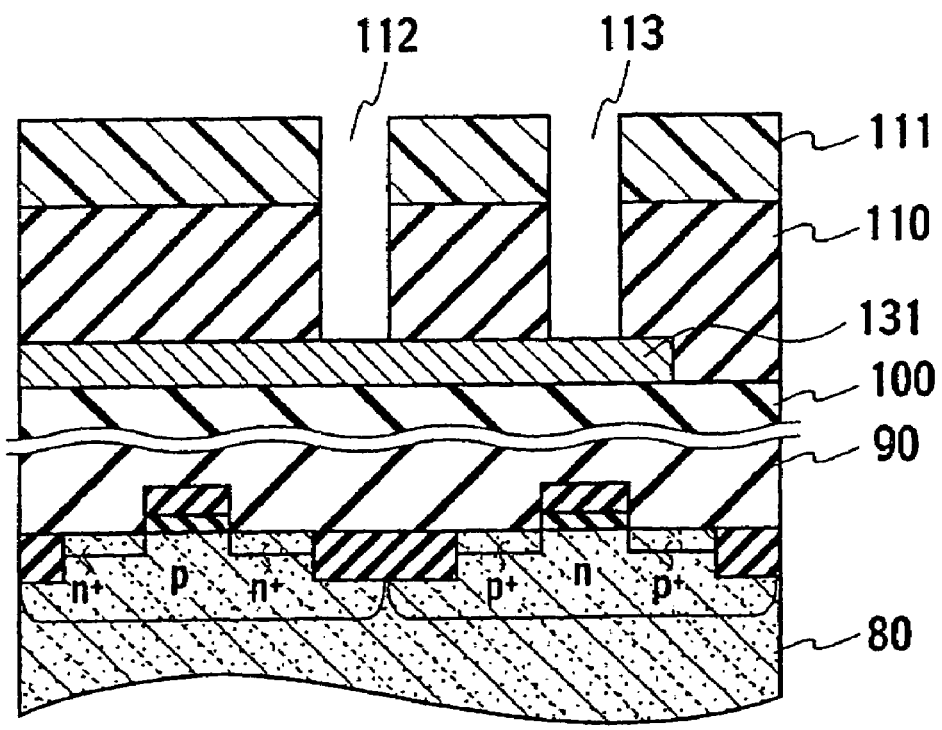
Figure 23:
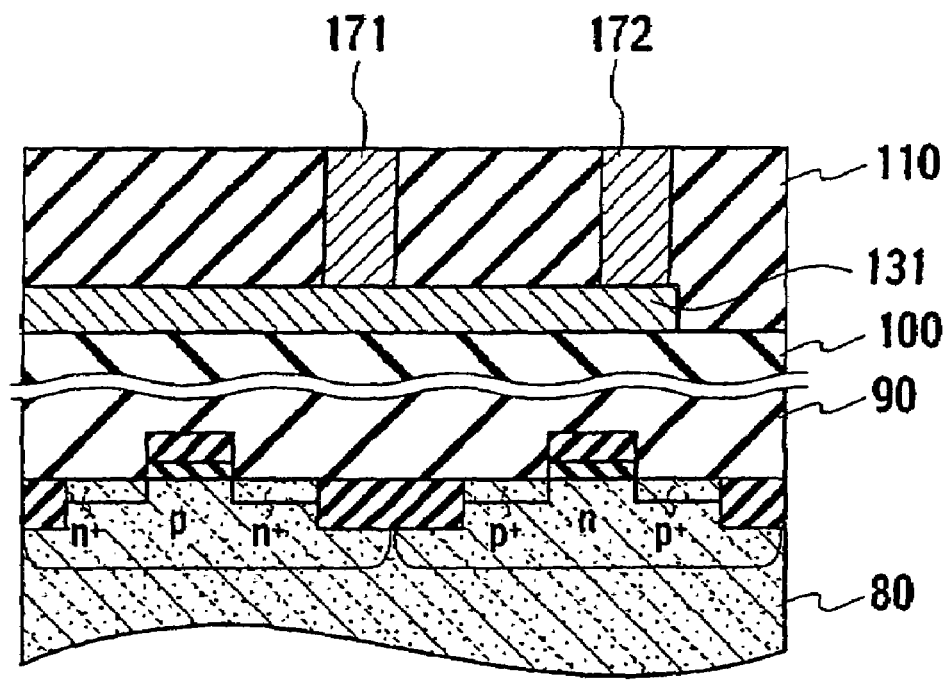
FIG. 23 is a cross-sectional view taken on line XXIII-XXIII in FIG. 23.
Figure 24:
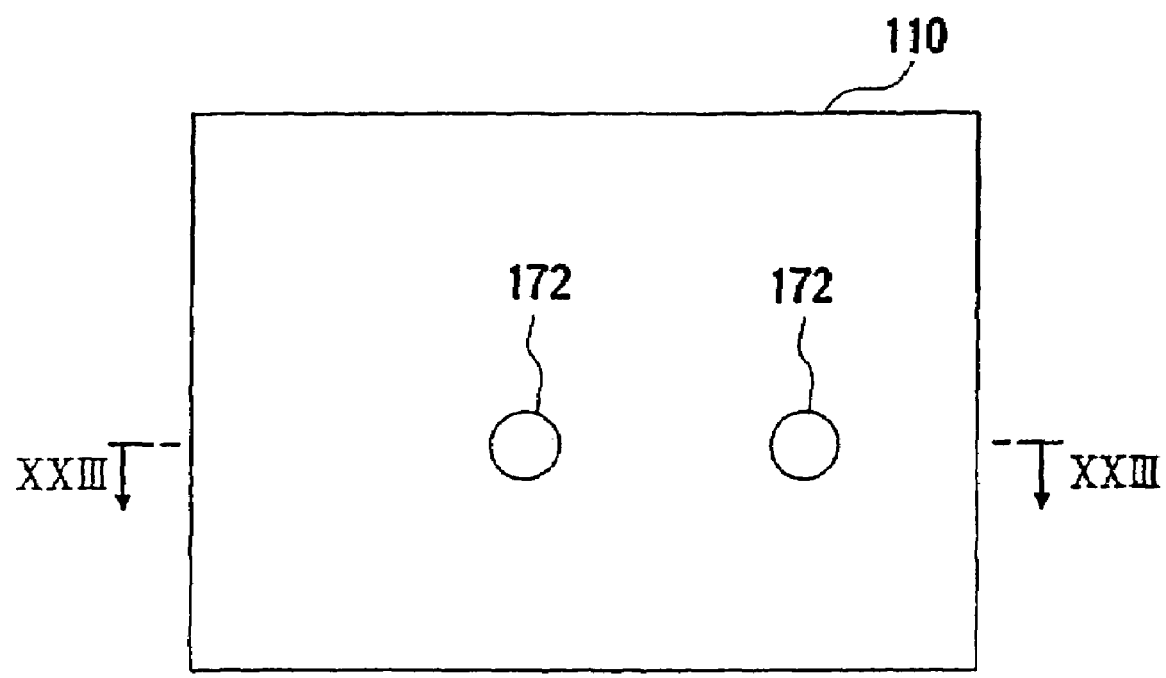
FIG. 24 is a plan view of the semiconductor integrated circuit according to the embodiment of the present invention.

As shown in FIG. 21, the k-th interlayer insulating film 110 is deposited on the lower-layer wiring 131 and the (k−1)-th interlayer insulating film 100 by CVD or the like, and is planarized. A photoresist film 111 is deposited thereon. The photoresist film 111 is patterned by using the reticle made in accordance with the layout shown in FIG. 5, a part of the k-th interlayer insulating film 110 is selectively removed, and openings (via holes) 112 and 113 are formed as shown in FIG. 22. After the photoresist film 111 is removed, a refractory metal, such as tungsten (W) and molybdenum (Mo), is buried in the via holes 112 and 113 by sputtering, evaporation, or the like, and a surface thereof is then planarized. Then, the first via 171 and the second via 172 are individually formed as shown in a cross-sectional view of FIG. 23 and a plan view of FIG. 24.

Figure 25:
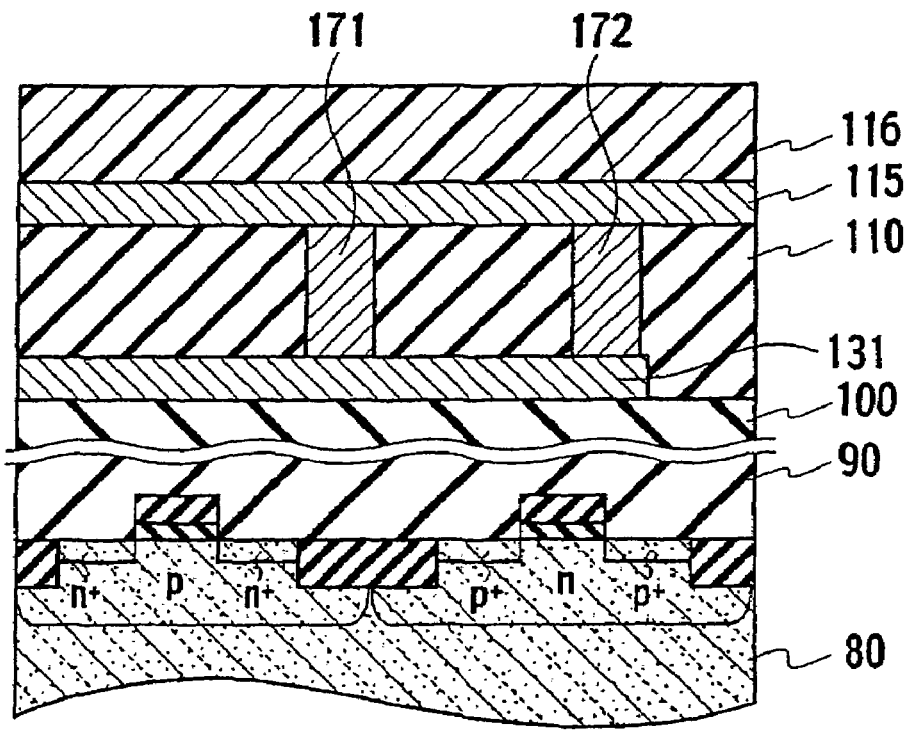
FIGS. 25 and 26 are cross-sectional views illustrating the method of manufacturing the semiconductor integrated circuit according to the embodiment of the present invention.
Figure 26:
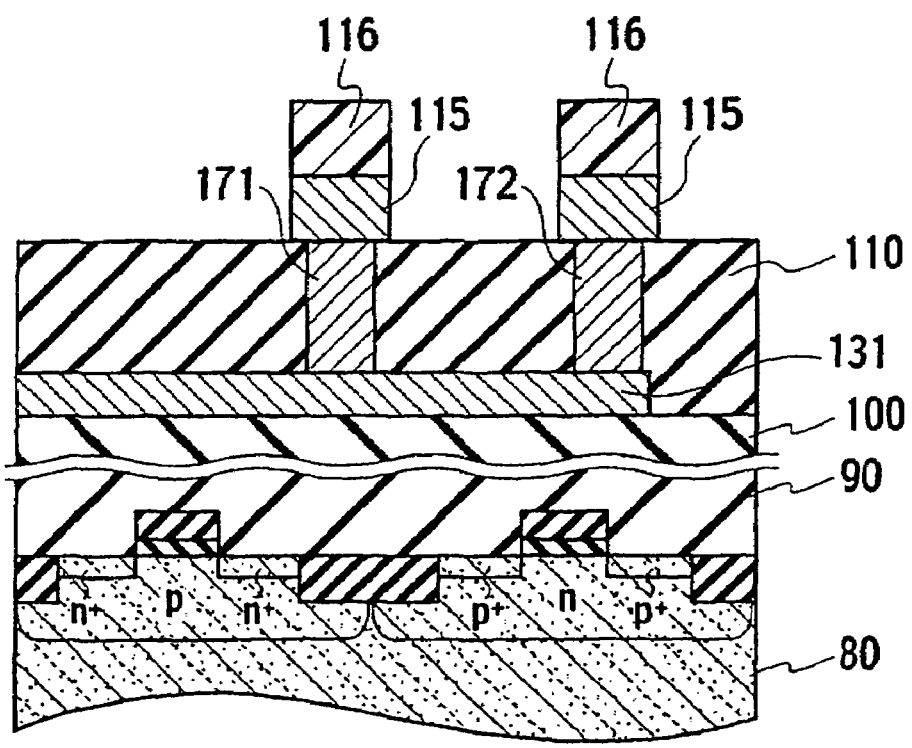
Figure 27:
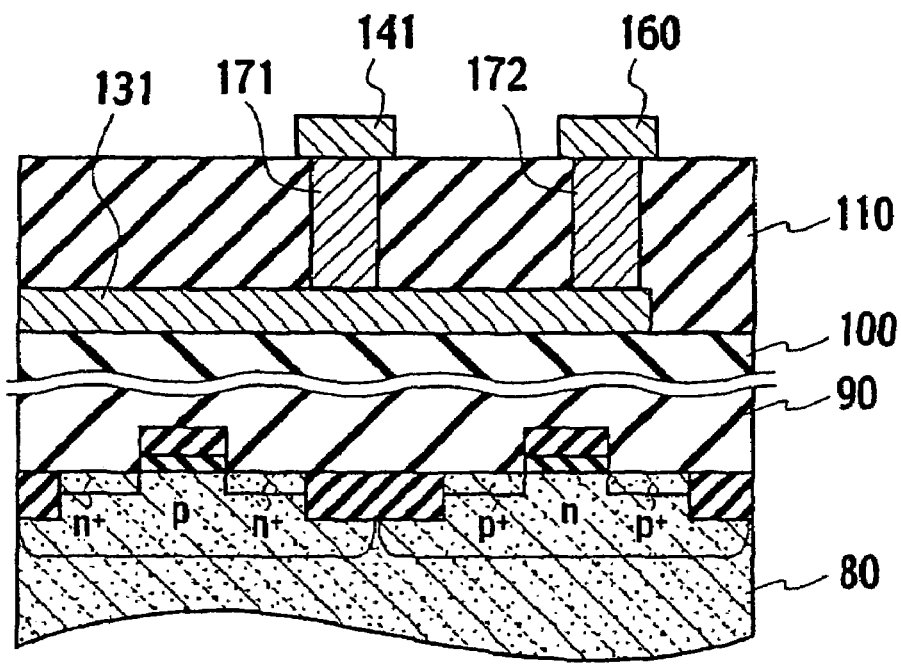
FIG. 27 is a cross-sectional view taken on line XXVII-XXVII in FIG. 28.
Figure 28:
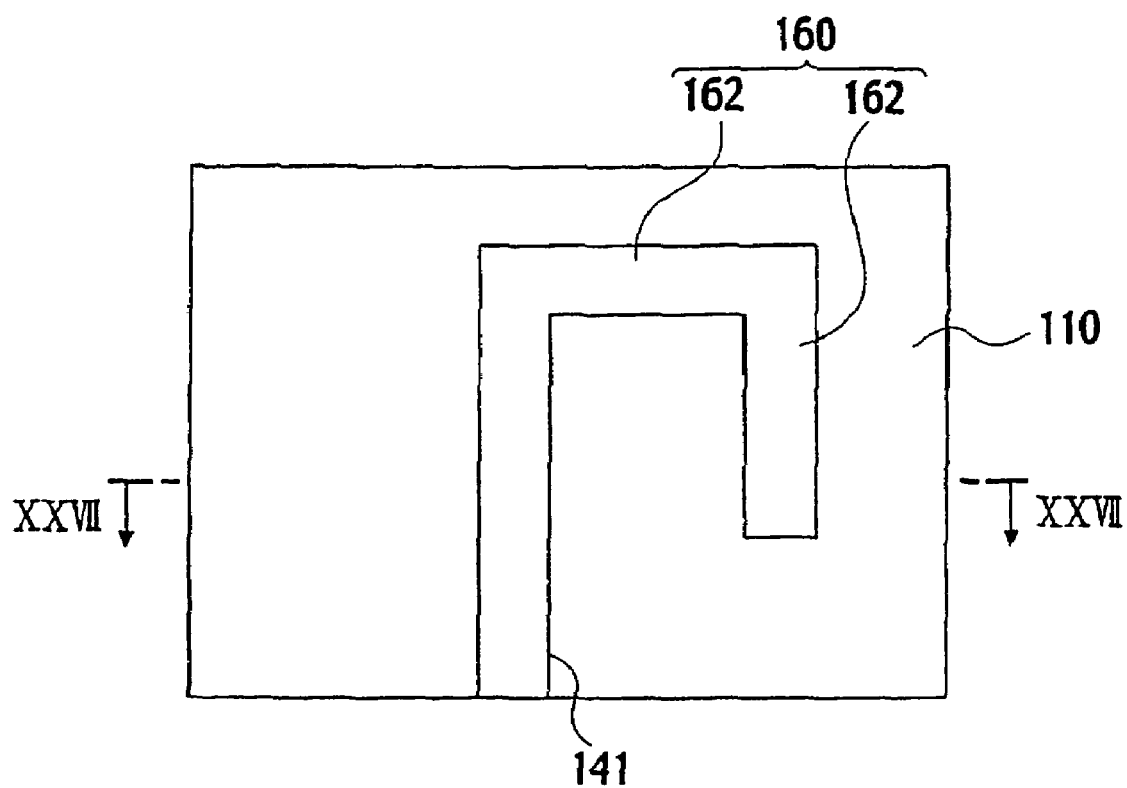
FIG. 28 is a plan view of the semiconductor integrated circuit according to the embodiment of the present invention.

As shown in FIG. 25, on the k-th interlayer insulating film 110, a conductive thin film 115 of Al, Cu, or the like is deposited by sputtering, evaporation, or the like. A photoresist film 116 is applied on the conductive thin film 115. Subsequently, the photoresist film 116 is patterned by using the reticle manufactured based on the layout shown in FIG. 5, and as shown in FIG. 26, a part of the conductive thin film 115 is selectively removed by using the patterned photoresist film 116 as a mask. By removing the remaining photoresist film 116, the upper-layer wiring 141 and the detour wiring 160 are formed on the k-th interlayer insulating film 110, as shown in FIGS. 27 and 28.

In accordance with the manufacturing method of the semiconductor integrated circuit set forth in the embodiment, since the plurality of wiring layers are connected to each other by the plurality of vias, it is possible to prevent an increase of resistance and a disconnection of the wiring due to a via defect and the like. Accordingly, the yield and the reliability of the semiconductor integrated circuit can be improved.

Modification of the Embodiment

Referring now FIGS. 3B to 3D and 29 to 33, examples of the other via cell patterns 130b to 130g to which the via cell creation module 13 can be applied will be described below. The shapes of the via cell patterns 130b to 130g are shown as examples, but other various shapes besides the above may also be available.

Figure 3A:
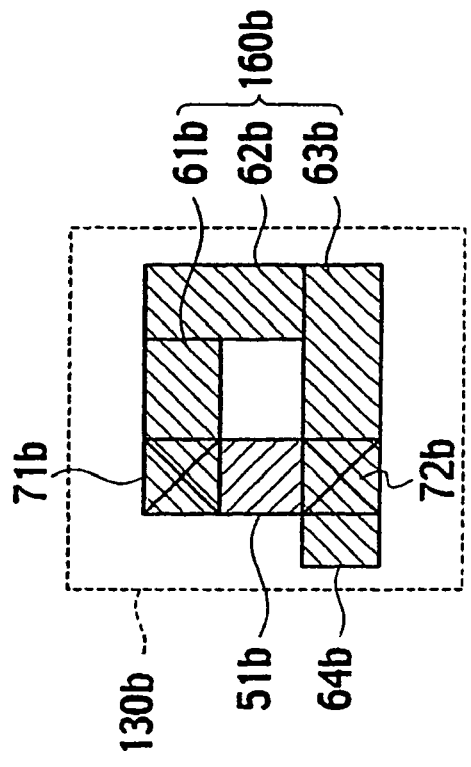
FIGS. 3A, 3B, 3C, and 3D are schematic diagrams of via cell patterns according to the embodiment of the present invention.
Figure 3B:
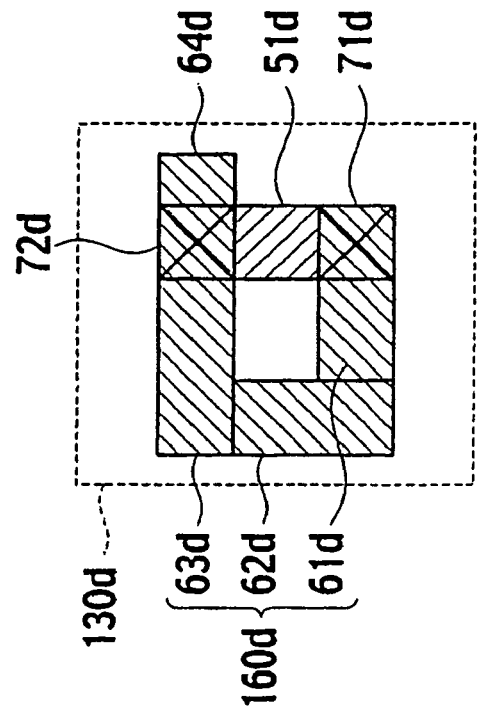

FIG. 3B shows an example of the via cell pattern 130b in the case of rotating the via cell pattern 130a shown in FIG. 3A clockwise by 90 degrees. The via cell pattern 130b includes an upper-layer extended pattern 61b, a first detour pattern 62b connected to the upper-layer extended pattern 61b in a direction perpendicular to the longitudinal direction thereof, a second detour pattern 63b connected to the first detour pattern 62b in a direction perpendicular to the longitudinal direction thereof, a terminal end correction pattern 64b connected to an end of the second detour pattern 63b, first and second via patterns 71b and 72b arranged on the ends of the upper-layer extended pattern 61b and the second detour pattern 63b, respectively, and a lower-layer extended pattern 51b disposed under the first detour pattern 62b and the second detour pattern 63b through the first and second via patterns 71b and 72b.

Figure 29:
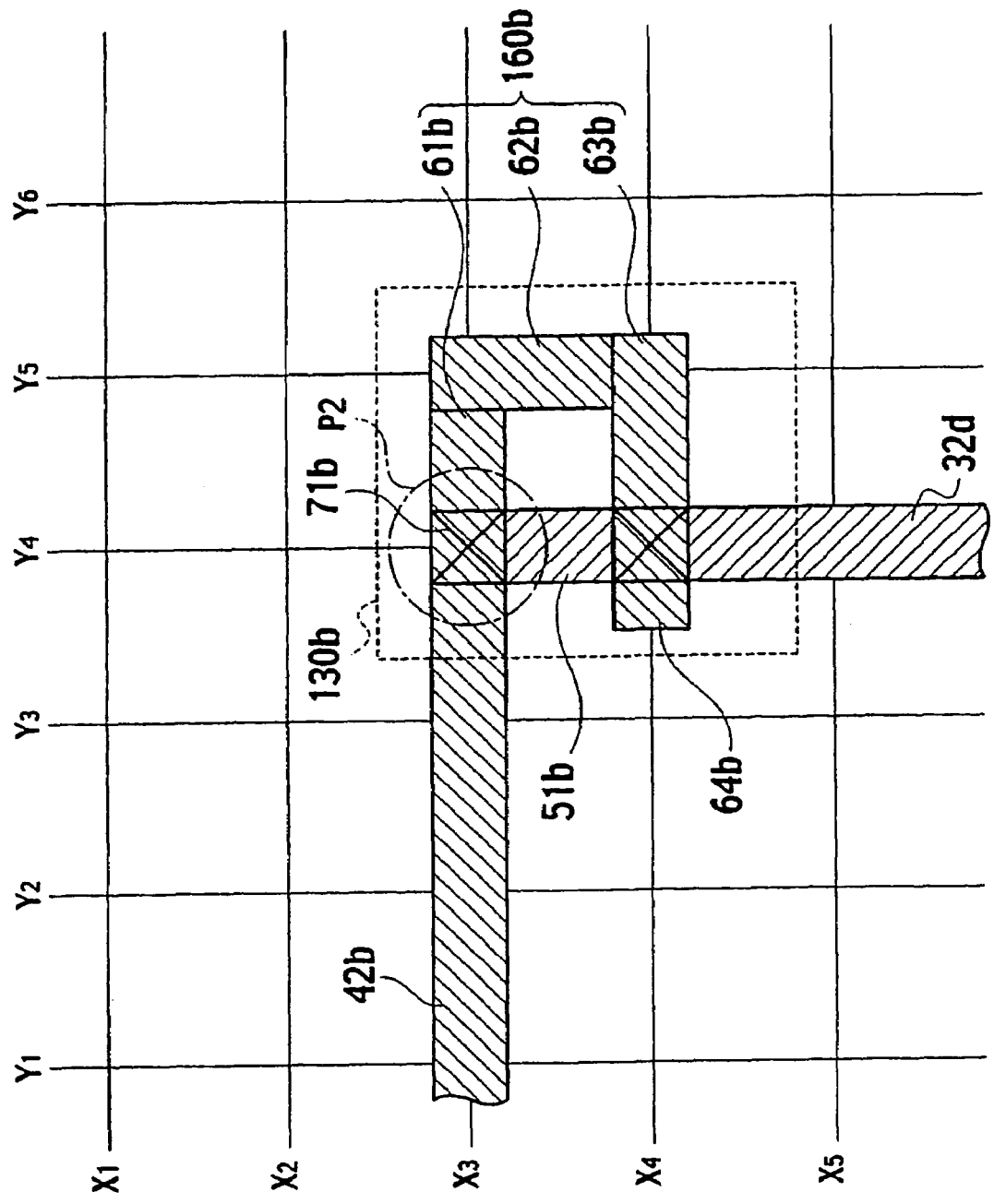

The via cell pattern 130b shown in FIG. 3B is suitable, for example, for a layout pattern as shown in FIG. 29. A lower-layer wiring pattern 32d is set in a direction parallel to the grids $Y_1, Y_2, Y_5$ as the preferential direction thereof disposed on the grids $X_1, X_2, \ldots, X_5$ and the grids $Y_1, Y_2, \ldots, Y_5$ set on the chip region. An upper-layer wiring pattern 42b is set in a direction parallel to the grids $X_1, X_2, \ldots, X_5$ as the preferential direction on the lower-layer wiring pattern 32d. The first via pattern 71b of the via cell pattern 130b is positioned on an intersection P2 of the upper-layer wiring pattern 42b and the lower-layer wiring pattern 32d, and the upper-layer extended pattern 61b is connected to the upper-layer wiring pattern 42b at the intersection P2 in the longitudinal direction thereof.

Figure 3C:
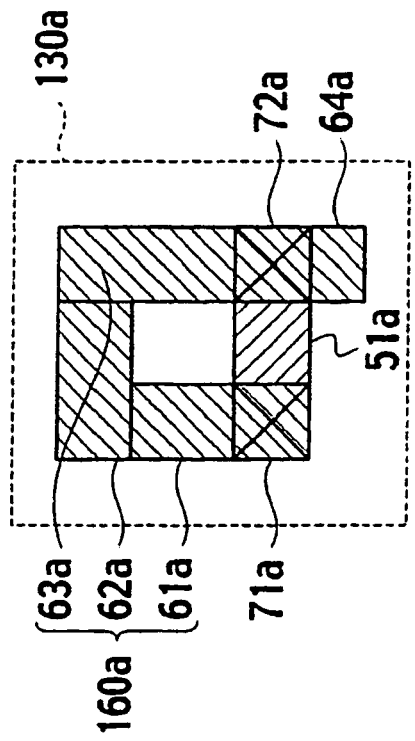

FIG. 3C shows an example of a via cell pattern 130c in the case of inverting the via cell pattern 130a shown in FIG. 3A with respect to an upper-layer extended pattern 61c as an axis. The via cell pattern 130c includes the upper-layer extended pattern 61c, a first detour pattern 62c connected to the upper-layer extended pattern 61c in a direction perpendicular to the longitudinal direction thereof, a second detour pattern 63c connected to the first detour pattern 62c in a direction perpendicular to the longitudinal direction thereof, a terminal end correction pattern 64c connected to an end of the second detour pattern 63c, first and second via patterns 71c and 72c arranged on the ends of the upper-layer extended pattern 61c and the second detour pattern 63c, respectively, and a lower-layer extended pattern 51c disposed under the first detour pattern 62c and the second detour pattern 63c through the first and second via patterns 71c and 72c.

The via cell pattern 130c shown in FIG. 3C is suitable, for example, for a layout pattern as shown in FIG. 30. A lower-layer wiring pattern 33c is set in the direction parallel to the grids $X_1, X_2, \ldots, X_5$ as the preferential direction on the grids $X_1, X_2, \ldots, X_5$ and the grids $Y_1, Y_2, \ldots, Y_5$ set on the chip region. On the lower-layer wiring pattern 33c, an upper-layer wiring pattern 43c setting the direction parallel to the grids $Y_1, Y_2, \ldots, Y_5$ as the preferential direction thereof is provided. The first via pattern 71c of the via cell pattern 130c is positioned on an intersection P3 of the lower-layer wiring pattern 33c and the upper-layer wiring pattern 43c, and the upper-layer extended pattern 61c is connected to the upper-layer wiring pattern 43c at the intersection P3 in the longitudinal direction thereof.

Figure 3D:
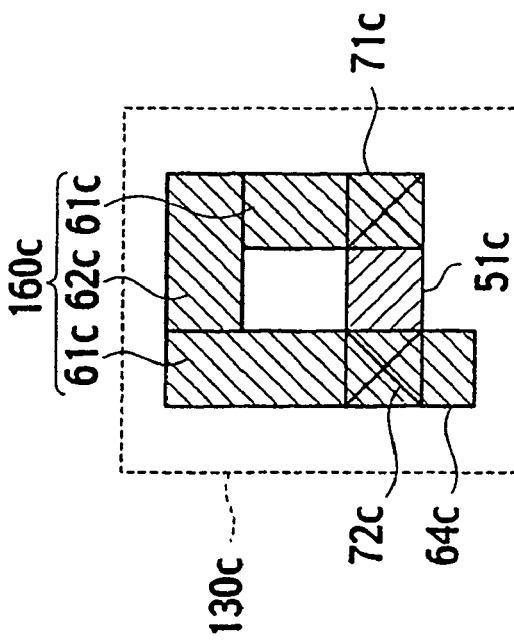

FIG. 3D shows a via cell pattern 130d in the case of rotating the via cell pattern 130c shown in FIG. 3c clockwise by 90 degrees. The via cell pattern 130d includes an upper-layer extended pattern 61d, a first detour pattern 62d connected to the upper-layer extended pattern 61d in a direction perpendicular to the longitudinal direction thereof, a second detour pattern 63d connected to the first detour pattern 62d in a direction perpendicular to the longitudinal direction thereof, a terminal end correction pattern 64d connected to an end of the second detour pattern 63d, first and second via patterns 71d and 72d arranged on the ends of the upper-layer extended pattern 61d and the second detour pattern 63d, respectively, and a lower-layer extended pattern 51d disposed under the first detour pattern 62d and the second detour pattern 63d through the first and second via patterns 71d and 72d.

Shape information on the via cell patterns 130b to 130d shown in FIGS. 3B to 3D are easily formed if a library exchange format (LEF) based on the shape of the via cell pattern 130a shown in FIG. 3A is deformed so as to have desired shape and size. The shape information may also be created by the via cell creation module 13 in accordance with the method shown in Steps S111 to S117 shown in FIG. 12.

Moreover, with regard to the shapes of the via cell patterns 130a to 130d, four vias are adopted as the vias connecting the upper and lower wiring layers to each other as shown in FIG. 31, thus making it possible to prevent the decrease in yield owing to the via defect. For example, in a layout example shown in FIG. 31, a lower-layer detour pattern 150e is connected to the lower-layer wiring pattern 31b extended parallel to the grids $X_1, X_2, \ldots, X_5$. An upper-layer detour pattern 160e is connected to the upper-layer wiring pattern 41d disposed on the lower-layer wiring pattern 31b and extended parallel to the grids $Y_1, Y_2, \ldots, Y_5$.

The lower-layer detour pattern 150e includes a lower-layer extended pattern 51e connected to the lower-layer wiring pattern 31b, a lower-layer first detour pattern 52e connected to the lower-layer extended pattern 51e, and a lower-layer second detour pattern 53e connected to the lower-layer first detour pattern 52e. The lower-layer detour pattern 150e forms a U-shape by the lower-layer extended pattern 51e, the lower-layer first detour pattern 52e, and the lower-layer second detour pattern 53e. The upper-layer detour pattern 160e includes an upper-layer extended pattern 61e connected to the upper-layer wiring pattern 41d, an upper-layer first detour pattern 62e connected to the upper-layer extended pattern 61e, and an upper layer second detour pattern 63e connected to the upper-layer first detour pattern 62e. The upper layer detour pattern 160e also forms a U-shape by the upper-layer extended pattern 61e, the upper-layer first detour pattern 62e, and the upper-layer second detour pattern 64e.

The lower-layer detour pattern 150e and the upper-layer detour pattern 160e are electrically connected to each other by a first via pattern 71e, a second via pattern 72e, a third via pattern 73e, and a fourth via pattern 74e, which are individually arranged on intersections of the lower-layer detour pattern 150e and the upper-layer detour pattern 160e. The via cell pattern 130e is composed of the first to fourth via patterns 71e to 74e, the lower-layer detour pattern 150e, and the upper-layer detour pattern 160e.

A "#-shape" as shown in FIG. 32 can be used for a via cell pattern 130f having four vias. The via cell pattern 130f shown in FIG. 32 includes a lower-layer detour pattern 150f, an upper-layer detour pattern 160f, and first to fourth via patterns 71f to 74f electrically connecting the lower-layer detour pattern 150f and the upper layer detour pattern 160f to each other. The lower-layer detour pattern 150f includes a lower-layer extended pattern 51f connected to the lower-layer wiring pattern 31b, and a lower-layer second detour pattern 53f disposed parallel to the longitudinal direction of the lower-layer extended pattern 51f. The upper-layer detour pattern 160f includes an upper-layer extended pattern 61f connected to the upper-layer wiring pattern 41d, and an upper-layer second detour pattern 63f disposed parallel to the longitudinal direction of the upper-layer extended pattern 61f. Note that the via cell pattern 130f shown in FIG. 32 is suitable for disposition onto a spot where the "U-shape" as shown in FIG. 31 is prohibited in terms of a manufacturing process.

The via cell pattern 130g shown in FIG. 33 shows an example of disposing a meander-like upper-layer detour pattern 160g on the upper-layer wiring pattern 41d. The upper-layer detour pattern 160g includes an upper-layer extended pattern 61g connected to the upper-layer wiring pattern 41d, a first detour pattern 62g connected to the upper-layer extended pattern 61g, a second detour pattern 63g connected to the first detour pattern 62g, a third detour pattern 65g connected to the second detour pattern 63g, and a fourth detour pattern 66g connected to the third detour pattern 65g. A terminal end correction pattern 68g is connected to the fourth detour pattern 66g. To the end of the lower-layer wiring pattern 31b, a lower-layer extended pattern 51g for connecting the lower-layer wiring pattern 31b to the upper-layer detour pattern 160g is connected. On intersections of the upper-layer detour pattern 160g and the lower-layer extended pattern 51g, a first via pattern 71g, a second via pattern 72g, and a third via pattern 73g are arranged. Even in the case of using the via cell pattern 130g shown in FIG. 32, the upper and lower wiring layers can be connected to each other by the plural vias, and accordingly, the yield of the semiconductor integrated circuit can be improved.

Other Embodiments

Various modifications will become possible for those skilled in the art after receiving the teachings of the present disclosure without departing from the scope thereof.

As the semiconductor integrated circuit according to the embodiment, the semiconductor integrated circuit manufactured based on the layout of the via cell pattern 130a shown in FIG. 3A has been described. However, it is a matter of course that it is possible to manufacture the semiconductor integrated circuit also in the case of being based on the layouts shown in FIGS. 3B to 3D and 29 to 32 besides the layout shown in FIG. 3A. For example, by using the layout shown in FIG. 29, it is possible to manufacture the semiconductor integrated circuit including the U-shape detour wiring in each of the upper and lower wiring layers. Moreover, by using the layout shown in FIG. 33, it is possible to manufacture the semiconductor integrated circuit including the #-shape detour wiring on the plane pattern. The position where the detour wiring is disposed is not limited to the two upper and layer wiring layers, and according to needs, the detour wiring can also be disposed in the other wiring layers.

The design method using the two upper and lower wiring layers has been described in the above-described embodiment. However, the design method is also adoptable for a design process of a semiconductor integrated circuit with a multi-layer interconnection including more than two wiring layers. In this case, a pattern shape using a single-cut via, which is generally used at present, can be combined with the pattern shapes of the above-described via cell patterns 130a to 130g.

The design method according to the above-described embodiment is suitable for a design of a large-scale integrated circuit in which the miniaturization of the wiring is advanced. For example, as shown in FIG. 8, the design method is partially applied to the wiring layer on the plural macro cells and the logic cells on the chip region, such as the SRAM module 84, the ROM module 85, the DRAM module 89, and the CPU 87, thus making it possible to provide a semiconductor integrated circuit highly integrated at higher yield. Moreover, when the minimum interval between the wiring and the wiring falls down to 100 nm or less because the micro machining of the wiring has been required in recent years, the lowering of the yield owing to the via defect becomes significant. However, the design method according to this embodiment is applied to a semiconductor integrated circuit in which the wiring interval is 100 nm or less, thus making it possible to reduce a problem of a conduction failure owing to the via defect to a great extent. Therefore, it is possible to provide the semiconductor integrated circuit in which yield is improved.

What is claimed is:

1. A method for manufacturing a semiconductor integrated circuit using layout data designed by a sequence of processes, the sequence of processes comprising:

disposing a lower-layer wiring pattern on a lower-layer wiring layer implemented in a graphics image space, and an upper-layer wiring pattern perpendicular to the lower-layer wiring pattern on an upper-layer wiring layer implemented in the graphics image space;

providing a detour pattern including a first detour pattern connected to the upper-layer wiring pattern in a direction perpendicular to a longitudinal direction of the upper-layer wiring pattern and a second detour pattern connected to the first detour pattern in a direction perpendicular to a longitudinal direction of the first detour pattern;

providing a plurality of via patterns connecting the lower-layer and upper-layer wiring patterns at an intersection of the lower-layer and upper-layer wiring patterns on the detour pattern; and forming a via cell pattern based on the detour pattern and the via patterns, wherein the sequence of processes further comprises:

forming a terminal end correction pattern on a terminal end of the detour pattern in a direction parallel to a preferential direction defined in one of the lower-layer and upper-layer wiring patterns.

2. The method of claim 1, wherein the first detour pattern and the upper-layer wiring pattern are connected end portions of an upper-layer extended pattern extending from the intersection, respectively, so that the upper-layer extended pattern and the first and second detour patterns form a U-shape upper-layer detour pattern.

3. The method of claim 1, wherein the detour pattern includes a lower-layer extended pattern connected to the lower-layer wiring pattern in an extended direction thereof from the intersection, a third detour pattern connected to the lower-layer extended pattern in a direction perpendicular thereto, and a fourth detour pattern connected to the third detour pattern in a direction perpendicular thereto and in a direction parallel to the lower-layer wiring pattern, so that the lower-layer extended pattern and the third and fourth detour patterns form a U-shape lower-layer detour pattern.

4. A program configured to be executed by a computer for executing an application on a computer automated design system, comprising:
   disposing a lower-layer wiring pattern on a lower-layer wiring layer implemented in a graphics image space, and an upper-layer wiring pattern perpendicular to the lower-layer wiring pattern on an upper-layer wiring layer implemented in the graphics image space;
   providing a detour pattern including a first detour pattern connected to the upper-layer wiring pattern in a direction perpendicular to a longitudinal direction of the upper-layer wiring pattern and a second detour pattern connected to the first detour pattern in a direction perpendicular to a longitudinal direction of the first detour pattern;
   providing a plurality of via patterns connecting the lower-layer and upper-layer wiring patterns at an intersection of the lower-layer and upper-layer wiring patterns on the detour pattern;
   forming a via cell pattern based on the detour pattern and the via patterns; and
   forming a terminal end correction pattern on a terminal end of the detour pattern in a direction parallel to a preferential direction defined in one of the lower-layer and upper-layer wiring patterns.

5. A semiconductor integrated circuit comprising:
   a lower-layer wiring;
   an interlayer insulating film provided on the lower-layer wiring;
   first and second vias provided in the interlayer insulating film and connected to the lower-layer wiring;
   an upper-layer wiring provided on the interlayer insulating film extending perpendicularly to a longitudinal direction of the lower-layer wiring, and intersecting with the lower-layer wiring at a position of the first via on a plane pattern;
   a first detour wiring connected to the upper-layer wiring and formed in a direction perpendicular to a longitudinal direction of the upper-layer wiring;
   a second detour wiring connected to the first detour wiring and extending in a direction perpendicular to the first detour wiring, and intersecting with the lower-layer wiring at a position of the second via on the plane pattern;
   a third via provided in the interlayer insulating film and disposed on an intersection of the upper-layer wiring and the first detour wiring on the plane pattern; and
   a fourth via provided in the interlayer insulating film and disposed on an intersection of the first detour wiring and the second detour wiring on the plane pattern,
   wherein the upper-layer wiring is connected through the third via to the first detour wiring disposed on the same wiring layer as the lower-layer wiring, and the first detour wiring is connected through the fourth via to the second detour wiring disposed on the same wiring layer as the upper-layer wiring.

6. The semiconductor integrated circuit of claim 5, further comprising:
   third detour wiring connected to the lower-layer wiring on the same wiring layer as the lower-layer wiring and formed in the direction perpendicular to the lower-layer wiring;
   forth detour wiring connected to the third detour wiring on the same wiring layer as the lower-layer wiring and formed in a direction perpendicular to a longitudinal direction of the third detour wiring;
   a third via provided in the interlayer insulating film and connecting the upper-layer wiring and the fourth detour wiring to each other; and
   a fourth via provided in the interlayer insulating film and connecting the second detour wiring and the fourth detour wiring to each other.

7. The semiconductor integrated circuit of claim 5, further comprising:
   third detour wiring connected to the second detour wiring and disposed in a direction perpendicular to a longitudinal direction of the second detour wiring;
   fourth detour wiring connected to the third detour wiring and disposed in a direction perpendicular to a longitudinal direction of the third detour direction; and
   a third via buried in the interlayer insulating film and disposed on an intersection of the fourth detour pattern and the lower-layer wiring on the plane pattern.

* * * * *